US009063190B2

(12) United States Patent
Garshelis

(10) Patent No.: US 9,063,190 B2
(45) Date of Patent: Jun. 23, 2015

(54) MAGNETOSTATIC MEASUREMENT METHOD AND SENSOR FOR ASSESSING LOCAL HYSTERESIS PROPERTIES IN FERROMAGNETIC MATERIALS

(76) Inventor: Ivan Garshelis, Dalton, MA (US)

( * ) Notice: Subject to any disclaimer, the term of this patent is extended or adjusted under 35 U.S.C. 154(b) by 461 days.

(21) Appl. No.: 13/600,475

(22) Filed: Aug. 31, 2012

(65) Prior Publication Data

US 2013/0057271 A1    Mar. 7, 2013

Related U.S. Application Data

(60) Provisional application No. 61/573,312, filed on Sep. 2, 2011.

(51) Int. Cl.
*G01R 33/07*    (2006.01)
*G01R 33/12*    (2006.01)

(52) U.S. Cl.
CPC .................................. *G01R 33/123* (2013.01)

(58) Field of Classification Search
CPC ........ G01B 7/003; G01B 7/023; G01R 33/14; G01R 33/123
USPC ................................................ 324/251, 252
See application file for complete search history.

(56) References Cited

U.S. PATENT DOCUMENTS

| 4,950,988 | A | 8/1990 | Garshelis |
| 5,367,257 | A | 11/1994 | Garshelis |
| 7,437,942 | B2 | 10/2008 | Garshelis et al. |
| 2009/0013794 | A1 | 1/2009 | Garshelis et al. |

OTHER PUBLICATIONS

I.J. Garshelis, et al., "A Magnetic Position Sensor", Journal of Applied Physics, Nov. 1988, pp. 5699-5701, vol. 64, No. 10, Part 2.
I.J. Garshelis, et al., "An Improved Magnetic Position Sensor", IEEE Transactions on Magnetics, Sep. 1989, pp. 3833-3835, vol. 25, No. 5.
Ivan J. Garshelis, "A Magnetic Position Sensor", SAE Paper No. 90062, Sensors and Actuators, 1990, pp. 37-43, SP-805.
I.J. Garshelis et al., "A Motion Sensor Having Non-Volatile Direction Memory", IEEE Transactions on Magnetics, Nov. 1991, pp. 5429-5431, vol. 27, No. 6, Part 2.
Ivan J. Garshelis, "A New Type of Magnetic Motion Sensor and Its Application", SAE Paper No. 930235, Sensors and Actuators, 1993, pp. 35-43, SP-948.

(Continued)

*Primary Examiner* — Reena Aurora
(74) *Attorney, Agent, or Firm* — Stuart J. Friedman

(57) ABSTRACT

Method and sensor for obtaining comparative measurements of hysteresis loss in a ferromagnetic sample. A permanent magnet, polarized normal to the sample surface, is positioned on one side of the surface and is movable along a line of travel between motion limits. A field sensor is mounted in fixed spatial relation on the opposite side of the sample surface at the center of the line of travel. The magnet is moved in forward and reverse directions between the motion limits. The longitudinal magnetic field intensity and the coincidental magnet to field sensor longitudinal distance are sensed at a plurality of distances along the forward and reverse line of travel. For each distance, the difference, D(x), between forward and reverse magnetic fields is calculated and plotted against distance for determining the comparative hysteresis of the sample.

21 Claims, 22 Drawing Sheets

(56) References Cited

OTHER PUBLICATIONS

Ivan J. Garshelis et al., "Mechanical Work Associated With the Creation of Circumferentially Polarized Bands", Journal of Applied Physics, 2005, vol. 97, p. 10Q105.

Ivan J. Garshelis et al., "Drag Force Measurement: A Means for Determining Hysteresis Loss", Journal of Applied Physics, 2006, vol. 99, p. 08D910.

Ivan J. Garshelis et al., "Determination of Hysteresis Loss by Drag Force Measurements with Cancelled Normal Field Components", Technical Digests of the International Magnetics Conference (Intermag), May 8-12, 2006, p. 593, San Diego, CA, USA.

Lode Vandenbossche et al., "Magnetic Nondestructive Evaluation of Bending Fatigue Damage Using the Drag Force Method", IEEE Transactions on Magnetics, Jun. 2007, pp. 2746-2748, vol. 43, No. 6.

Ivan J. Garshelis et al., "Sensing Local Inhomogeneity in Electrical Steels by the Drag Force Method", Journal of Applied Physics, Apr. 2008, pp. 07E936-07E936-3, vol. 103, No. 7.

Ivan J. Garshelis et al., "Assessment of Shot Peening Uniformity by Magnetic Drag Force Measurements", Journal of Applied Physics, Apr. 2009, pp. 07E711-07E711-3, vol. 105, No. 7.

Peter Sergeant et al., "Numerical Model for the Drag Force Method to Evaluate Hysteresis Loss", IEEE Transactions on Magnetics, Jun. 2008, vol. 44, No. 6.

Ivan J. Garshelis et al., "Application of the Drag Force Method to Evaluate Magnetic Property Degradation Near the Cut Edges of Electrical Steels", Journal of Applied Physics, 2011, vol. 109, p. 07E518.

Ivan J. Garshelis et al., "A Simple Magnetostatic Measurement Method for Assessing Hysteresis Losses in Ferromagnetic Sheet Materials", Abstract, Program of SMM20 Conference, Sep. 5, 2011, Kos Island, Greece.

I. J. Garshelis et al., "New Magnetic NDT Technology: A Moving Magnet Hysteresis Comparator", Poster Presentation at MMM 2011, Oct. 30, 2011-Nov. 3, 2011, Scottsdale, AZ, USA.

Ivan J. Garshelis et al., "A Simple Magnetostatic Measurement Method for Assessing the Local Hysteresis Properties in Ferromagnetic Sheet Materials", Journal of Sensors, 2012, seven (7) pages, vol. 2012, Article ID 870916, doi: 10.1155/2012/870916.

Ivan J. Garshelis et al., "Nondestructive Detection of Inhomogeneity in the Magnetic Properties of Materials With a Moving Magnet Hysteresis Comparator", IEEE Transactions on Magnetics, Nov. 2012, vol. 48, No. 11, Oral Presentation at 2012 Intermag, May 7-11, 2012, Vancouver, Canada.

G. Crevecoeur et al, "Analysis of the Local Material Degradation Near Cutting Edges of Electrical Steel Sheets", IEEE Trans Magn., Jun. 2008, vol. 44, p. 3173-3176.

G. Crevecoeur et al, "Local Identification of Magnetic Hysteresis Properties Near Cutting Edges of Electrical Steel Sheets", IEEE Trans Magn., Jun. 2008, vol. 44, p. 1010-1013.

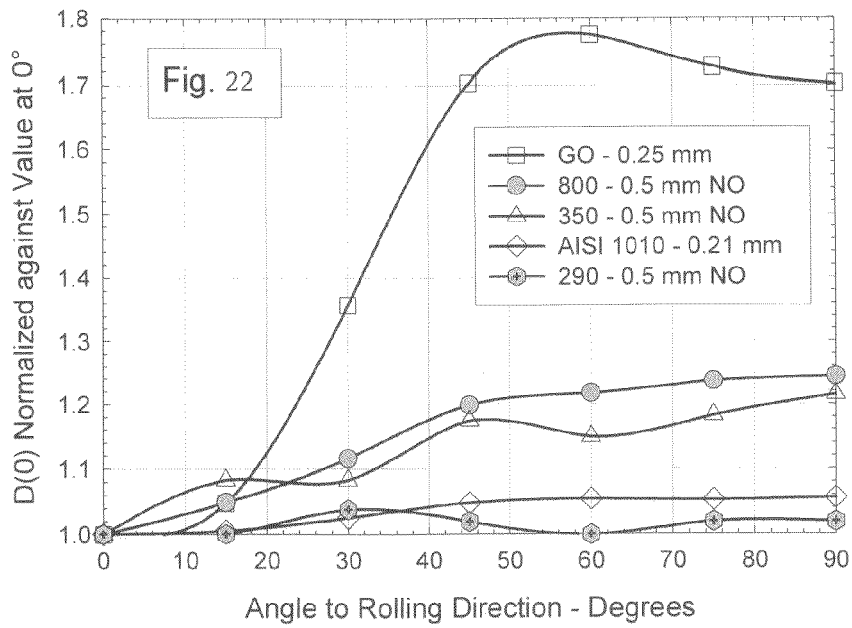
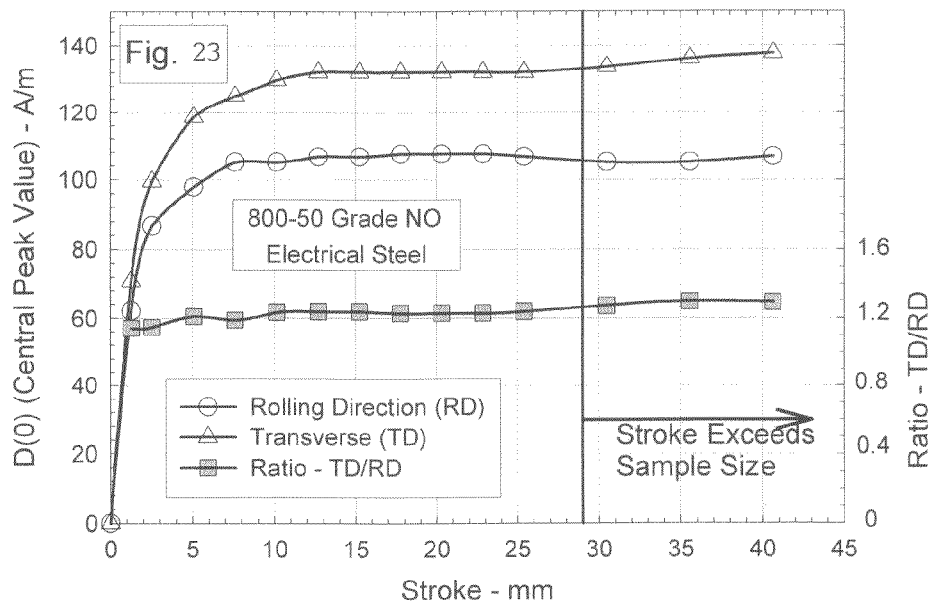

MAGNETOSTATIC MEASUREMENT METHOD AND SENSOR FOR ASSESSING LOCAL HYSTERESIS PROPERTIES IN FERROMAGNETIC MATERIALS

CROSS-REFERENCE TO RELATED APPLICATIONS

This is a non-provisional application based upon U.S. provisional application Ser. No. 61/573,312, filed Sep. 2, 2011.

FIELD OF THE INVENTION

The present invention relates generally to a new magnetostatic sensor and method for obtaining comparative measurements of hysteresis properties in ferromagnetic sheet materials and, more particularly, to a sensor and method wherein the difference in magnetic field pattern arising from large gradients in the local magnetization induced by forward and reverse movement of a permanent magnet relative to a sample is correlated to the sample's hysteresis properties.

BACKGROUND OF THE INVENTION

Hysteresis properties are not only a critical factor in the selection of steels for use in electrical machines but, by their nature, can also provide significant information on the structural condition and/or magnetic anisotropy of ferromagnetic materials generally. With electrical steels, the energy loss itself is the usual parameter of prime interest, whereas one or both of its typically key components namely, coercivity and the remanent induction provide the sought for information.

Conventional measurements of hysteretic properties usually employ ring or strip samples, the latter being necessary when anisotropy is being explored (see, M. Emura, et al., "Angular Dependence of Magnetic Properties of 2% Silicon Electrical Steel, *J. Magn. Magn. Mat.*, vol. 226-230, Part 2, pp. 1524-1526 (2001)). Non destructive determinations of local properties, for example to explore the relative structural damage associated with different processes used to cut electrical steel sheets, typically require either specially prepared samples (see, E. G. Araujo, et al., "Dimensional Effects on Magnetic Properties of Fe—Si Steels Due to Laser and Mechanical Cutting", *IEEE Trans. Magn., vol.* 46, no. 2, pp. 213-216 (February 2010)), sophisticated techniques such as the needle probe method (see, G. Crevecoeur, et al., "Analysis of the Local Material Degradation Near Cutting Edges of Electrical Steel Sheets", *IEEE Trans. Magn., vol.* 44, no. 11, pp. 3173-3176 (November 2008)) or specialized apparatus such as with the drag force method (see, I. J. Garshelis, et al., "Application of the Drag Force Method to Evaluate Magnetic Property Degradation Near the Cut Edges of Electrical Steels", *J. Appl. Phys.* 109, 07E518 (2011)). All methods except drag force employ magnetic fields derived from electric currents.

Evaluating magnetic hysteresis properties is typically achieved through the use of, e.g., an Epstein frame or a single sheet tester. Measurement in such apparatus gives the global magnetic hysteresis properties averaged over the cross section and length of the sample under test. This is usually suitable for materials whose end use is in electrical machines. For many applications, however, inhomogenity of magnetic properties is the characteristic of principal interest, since variation in local properties is reflective of variation in their origins, namely: composition, microstructure, residual stress, and the detection of inhomogeneous metallurgical conditions is the underlying purpose of the measurement.

Therefore, a new magnetostatic sensor and method for obtaining comparative measurements of hysteresis components in ferromagnetic sheet materials is needed where the measurements obtained provide quantitative information which correlates directly with all of the significant aspects of conventional hysteresis loops.

SUMMARY OF THE INVENTION

In accordance with one broad aspect of the present invention there is provided a non-contact magnetic sensor for non-destructively determining magnetic property changes in a ferromagnetic sheet material sample by providing sensitive indications of salient hysteresis features of the ferromagnetic material, comprising:

permanent magnet means spaced closely adjacent to and a known distance from one surface of said sample, said magnet being polarized normal to said one surface and presenting a constant polarity to said surface;

at least one active field sensor means positioned along the surface of said sample opposite from said one surface, at a fixed position relative to said sample and at a known distance from said opposite surface;

said permanent magnet means and said at least one surface being mounted for and capable of relative back and forth reciprocating motion along a fixed line of travel whereby no point on said at least one surface is permitted to pass the magnet means more than once without changing direction, said field sensor means being positioned along and at the center of the line of travel, said surface being generally flat or gently curved in the direction of motion; and said field sensor means having a sensing axis oriented to sense longitudinal fields arising from said magnet and from the gradient of magnetization arising in said sample;

whereby said magnetic field H(x) at said field sensor means for a number of corresponding magnet distances x from the field sensor means along the line of travel for both directions of back and forth movement between the magnet means and said at least one surface can be sensed for each direction of movement, the directional difference, D(x), between H(x) at distance x in each direction calculated and D(x) plotted against x (D(x) signature) for determining the comparative hysteresis of said ferromagnetic sheet material sample.

In another broad aspect of the invention there is provided a method for obtaining comparative measurements of hysteresis loss in a ferromagnetic sheet material sample comprising the steps of:

(a) arranging a permanent magnet closely adjacent to but spaced a known distance from one surface of said sample, said magnet being polarized normal to said one surface and present a constant polarity to said surface;

(b) arranging at least one active field sensor along the surface of said sample opposite from said one surface at a fixed position relative to said sample and at a known distance from said opposite surface and orienting the sensing axis of said field sensor to sense longitudinal fields arising from said magnet and from the gradient of magnetization arising in said sample;

(c) mounting said permanent magnet and said one surface for relative back and forth reciprocating motion along a fixed line of travel and causing said relative back and forth motion wherein no point on said at least one surface is permitted to pass the magnet more than once without changing direction, said field sensor being positioned along and at the center of said line of travel, said surface being generally flat or gently curved in the direction of motion;

(d) sensing the intensity of the magnetic fields at said field sensor for a number of sensed magnet distances x from the field sensor along the line of travel for both directions of back and forth relative movement between the magnet and said at least one surface; and (e) converting said sensed magnetic field intensities H(x) and said sensed distances x for each direction of motion to separate electrical signals, calculating the directional difference, D(x), between H(x) in each direction for each distance x and plotting D(x) against x (D(x) signature) for determining the comparative hysteresis of said ferromagnetic sheet material sample from said plot.

In still another aspect of the invention the sensor further includes means for converting said sensed magnetic field intensities H(x) and said sensed distances x for each direction of motion to separate electrical signals.

In yet another aspect of the invention the sensor further includes a data acquisition system for processing the electrical signals, determining the directional differences, D(x), between sensed magnetic field intensities H(x) at each distance x of said magnet means from said field sensor means for both directions of back and forth motion and plotting D(x) vs. x, said plot providing information indicative of the hysteresis properties of the sample.

In another aspect of the invention the method further includes comparing the D(x) signature of said sample with the D(x) signature of a standard piece of said ferromagnetic sheet material, said D(x) signatures obtained under substantially identical conditions of magnetic field intensity, sample thickness and air gap between said magnet and said immediately adjacent surface of said sample or standard piece, wherein a higher or lower peak value of D(x) in the D(x) signature of said sample indicates increased or decreased hysteresis, respectively, in said sample.

In still another aspect of the invention the method further includes the steps of:

reversing the surfaces of said sample adjacent the magnet and the field sensor;

repeating steps (a) through (e) to obtain the D(x) signature of said sample in its reversed orientation;

comparing the D(x) signature of the sample in its original orientation with the D(x) sample of the sample in its reversed orientation, wherein different D(x) signatures in the original and reversed orientations indicates the presence and extent of property gradients within the sample.

In yet another aspect of the invention, wherein said ferromagnetic sheet material sample had been formed by a rolling process, the method further includes the steps of:

performing steps (a) through (e) for determining the D(x) peak at the field sensor for said sample when the line of travel is in the rolling direction (RD);

performing steps (a) through (e) for determining the D(x) peak at the field sensor for said sample when the line of travel is transverse to the rolling direction (TD) (90° to RD); and determining the ratio of D(x) peak in the TD to D(x) peak in the RD, wherein the difference between said ratio and 1.0 provides a quantitative indication of the anisotropy in magnetic hysteresis properties caused by the rolling process.

BRIEF DESCRIPTION OF THE DRAWINGS

FIG. 22 is a graphical representation of the peak value of the directional difference in sensed magnetic fields D(x) as a function of angle to the rolling direction for steel samples of the grades and thicknesses indicated.

FIG. 23 is a graphical representation of the peak value of the directional difference in sensed magnetic fields D(x) as a function of length of stroke of the magnet along its line of travel in the rolling direction (RD) and transverse to the rolling direction (TD) and of the ratio TD/RD as a function of length of stroke of the magnet.

DETAILED DESCRIPTION OF THE INVENTION

Figure 1A:
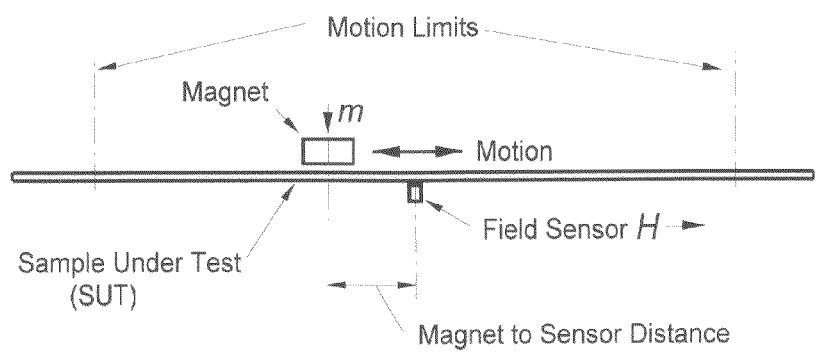
FIG. 1(a) is a schematic representation showing the basic arrangement of active elements of the magnetic, non-contacting hysteresis comparator sensor of the present invention.
Figure 1B:
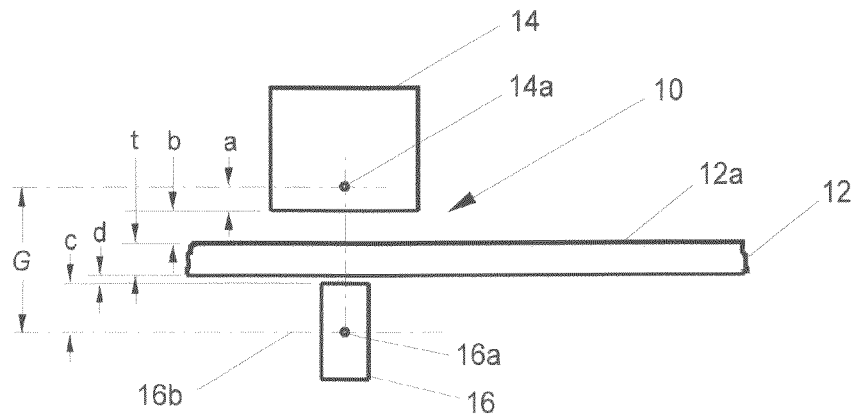
FIG. 1(b) is a magnified schematic representation of the active sensor elements showing the dimensional features thereof.

In accordance with the present invention there is provided a method and apparatus for detecting and providing an indication of the hysteresis properties of a ferromagnetic sample under test (SUT) in which, referring to FIG. 1(a), a field sensor (FS) is mounted in association with and in fixed and known spatial relation on one side of the SUT surface. A permanent magnet (PM), polarized normal to the SUT surface, is positioned on the opposite side of the SUT surface from the field sensor and at a fixed and known distance from the SUT surface and is movable along a line of travel a predetermined distance along the SUT surface. The distance between the motion limits of the line of travel of the magnet is called the "Stroke." The field sensor is located at the center of the Stroke, generally as close to the SUT surface as its physical package allows. The measurement method comprises moving the magnet, initially located at one end of the Stroke, at a speed slow enough (about 3 mm/s) such that making it slower does not significantly alter the results, along the line of travel on the face of the SUT at a small fixed separation distance (0.05-2.5 mm) from the face of the magnet to the surface of the SUT until it reaches the opposite Motion Limit at which time the motion is stopped. It is then moved, at the same speed and separation distance, back to its starting position. The size of the Stroke is typically 10 G to 20 G, where G represents the gap between the magnetic dipole location and the longitudinal sensing axis of the field sensor. Referring to FIG. 1(b), gap, G, is the sum of the distances a+b+t+c+d.

This "initializing" cycle of motion is repeated several times to obtain stable magnetization excursions within the SUT. During the next forward traversal of the Stroke, both the intensity of the field in the longitudinal direction, $H_F(x)$, and the coincidental longitudinal distance between the magnet and the field sensor, x, are measured and recorded at a plurality of distances x along the line of travel. After a momentary stop at the end of the Stroke, motion is resumed in the reverse direction, during which the field, $H_R(x)$, and corresponding position x are again measured and recorded at a plurality of distances x along the line of travel. For each recorded data pair (H(x), x), the difference, $H_F(x)-H_R(x)=D(x)$, is calculated. As will be seen, D(x) has some salient features (maxima, minima, and others) that correlate with the SUT's most salient hysteresis loss components.

Referring to the drawings to better understand the invention, and particularly to FIG. 1(b), the hysteresis comparator sensor 10 of the present invention is illustrated schematically together with a surface 12a of a ferromagnetic sheet material sample under test 12. As used hereinbefore and hereinafter, the term "sheet" includes not only sheets but also plates, bars, foils, films, ribbons and wires. Desirably, sample 12 is of constant thickness between opposed surfaces along the line of travel except where sample thickness is the characteristic under investigation. Permanent magnet 14 is capable of purely oscillatory motion, as indicated by the motion arrows in FIG. 1(a), e.g., back and forth reciprocating motion along a linear path or similar back and forth reciprocation along a fixed arcuate line of travel. This line of travel is an imaginary line on the surface 12a which maintains its spatial relationship to the permanent magnet 14 and field sensor 16. No point on the surface 12a may pass the magnet more than once without changing direction. Where the path is arcuate the magnetic moment of the magnet 14 is radial. If the curve has a variable radius (e.g., elliptical) the magnet holder could be equipped with rollers to maintain a constant gap between the magnet and the sample. Desirably, the overall length of the arcuate path is on the order of 5-20 times the distance between the dipole 14a of the magnet 14 and the location of the sensing element 16a in the field sensor 16. Field sensor 16 is positioned and oriented on the side of the sample under test 12 opposite to the side on which the magnet 14 moves to sense longitudinal fields arising from magnet 14 and from the gradient of magnetization. The surface 12a may be any flat or gently arcuate surface in the direction of motion. Desirably, surface 12a is also smooth and uninterrupted except when the smoothness of, or the existence of surface discontinuities in, the sample surface are the characteristics under investigation. As can be seen in FIG. 1(b), there are no interruptions in the surface 12a along the line of travel.

From a magnetic standpoint, an ideal ferromagnetic surface 12a will have a moderate coercivity, i.e., small enough to be locally magnetized to an extent and of a polarity determined by the field of the permanent magnet, and large enough to ensure a stable remanent magnetization, the polarity and intensity of which are reflective of the history of the motion of the permanent magnet and its effectively attached field pattern. These requirements are usually met without special consideration since most of the steels in common use have suitable coercivities (0.5 to 50 Oe). With very soft (low coercivity) materials it may be necessary to orient the apparatus to have the line of motion in the magnetic east-west direction to avoid having the field from the earth unduly affect the measurement. Still softer materials, e.g., permalloys or amorphous ribbons, may require that the apparatus be shielded from ambient fields from the earth or other sources.

In one embodiment of the hysteresis comparator sensor the permanent magnet is movable across the target surface along the line of travel and the field sensor is fixed in a known spatial relation to the target surface. For purposes of ease of description, the hysteresis comparator sensor 10 will be described herein in connection with this embodiment. However, it will be appreciated that, in another embodiment, the permanent magnet may be mounted in holders and fixed in position while the SUT/field sensor combination are the movable elements. Thus, there will be relative movement, as previously described herein, between the target surface and the permanent magnet irrespective of the embodiment of the hysteresis comparator sensor.

A permanent magnet 14 and at least one magnetic field sensor 16 are mounted by conventional mounting means in known spatial relationships to the sample 12 and on opposite sides of sample 12, with permanent magnet 14 being on the surface 12a side of sample 12. The moment m of magnet 14 is generally oriented to be substantially normal to sample surface 12a. When so oriented the spatial distribution of the field from magnet 14 within sample 12 is symmetrical and this is generally preferred. The sensing axis 16b of at least one field sensor 16 is oriented parallel to sample surface 12a at its respective location. Magnet 14 has a simple and convenient cross section, typically square, rectangular, or circular, and is desirably positioned with one pole thereof in close proximity to sample surface 12a and the other pole remote from the sample surface 12a. The magnet 14 need not be single magnet. Rather, it may comprise two or more magnets, spaced apart or adjacent, along the width of sample 12, having moments in a single plane normal to the line of travel with like poles of each magnet facing toward the sample 12. Moreover, the magnet 14 may comprise two or more magnets oriented to have collinear moments in order to obtain a greater moment than any one magnet alone, or to move their effective combined moment further from the sample surface 12a. Likewise the field sensor 16 need not be limited to a single sensor, but may comprise two or more sensors located along the line of travel and/or along the width of the sample 12.

The hysteresis comparator sensor 10 is made possible by the existence of modern high energy permanent magnet materials, such as NdFeBo (Neodymium-Iron-Boron) or SmCo (Samarium-Cobalt). These allow magnets having sufficient moment in a small enough volume to mimic a single dipole which is a point source of magnetic field. By having the positive and negative peaks of the field from the magnet close enough such that all possible intensities of magnetization between positive and negative saturation lie within a small enough length of the sample for the magnetization gradient to be sufficiently high to be the source of strong enough fields to be readily detectable such that the difference in field patterns between the two directions of motion (which contain the sought after hysteresis information) is readily measurable by such economical and simple means as a Hall Effect sensing device.

Field sensor 16 is typically a Hall effect, magnetoresistive, or fluxgate element but, in general, may be any device having an electrical output proportional to magnetic field intensity.

Without wishing to be bound to any particular theory, a better understanding of the method and sensor is enhanced from an understanding of the operational basis and the qualitative relationship between features of D(x) and hysteresis which can be obtained from an analytical model built from the following assumptions:

1. The existence of the signature features in D(x) reflects magnetic hysteresis in the sample; in the absence of hysteresis D(x)≡0.
2. The field from the magnet and its spatial distribution are approximated well enough by that of an equal moment dipole located within the magnet body.
3. A solution of the 2-D problem is sufficient.
4. The sample is assumed to be thin enough such that the field from the magnet, while varying with longitudinal position, is uniform throughout its thickness. This assumption, therefore, also ignores radial components of the field from the magnet.
5. The instantaneous local magnetization at points within the sample, M(x), are determined entirely by the instantaneous local field from the magnet, $H_L(x)$, and the history of changes in that field. It is recognized that $H_F(x)$ and $H_R(x)$ are each comprised of components from two sources, the magnet and $\nabla \cdot M(x)$ within the sample. Effects of these latter fields on M(x) are ignored on the assumption that they modify only the quantitative details of the D(x) signature features, not their presence.
6. The M-H characteristics of the sample can be defined by any function which results in closed, symmetrical, sigmoidal loops without concern for underlying physical sources, e.g., domain wall pinning or anisotropy. Thus suitable loops can be constructed from purposefully modified Langevin functions.

Guided by the previous assumptions, the analysis proceeds as follows:

(a) Determine the variation with x of the longitudinal component of the field ($H_L$) from the equivalent dipole source.

(b) Determine the sequence of field variation at underlying points in the sample during forward and reverse motion of the magnet, i.e., $H_L(x)_F$ and $H_L(x)_R$.

(c) Create families of hysteresis loops with variable loss densities and components, i.e., $M(H_L)$ functions with different values of coercivity and remanence.

(d) Determine M(x) for both directions of motion by transposing the sequence of field variation, i.e., $H_L(x)_F$ and $H_L(x)_R$ onto the $M(H_L)$ loops created in (c).

(e) Determine $\nabla \cdot M(x)$ (=$\phi$, the free-pole density) for each direction of motion. This becomes a second source (in addition to m) of the sensed field.)

(f) Determine $\nabla \phi(x) = -H$ for each direction of motion, i.e., $H_F(x)$ and $H_R(x)$.

(g) Determine $D(x)=H_F(x)-H_R(x)$, identify and characterize salient features.

(h) Correlate feature characterizations from (g) with hysteresis loop features from (c).

Figure 2:
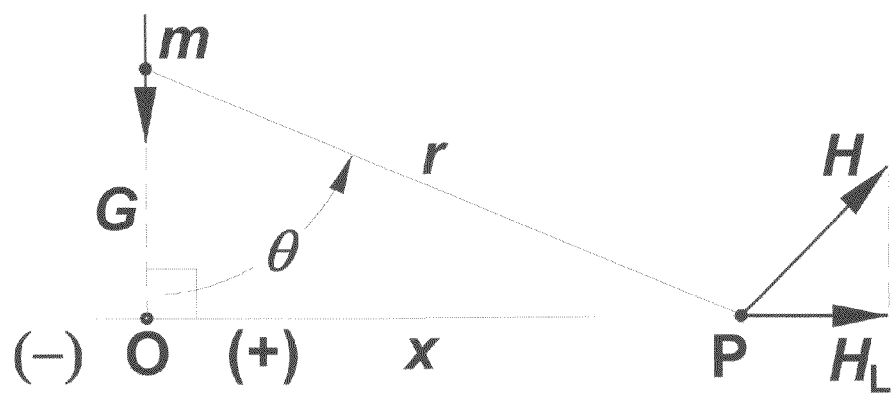
FIG. 2 is a graphical representation showing the field H at a point P, distance r and angle θ from a dipole of moment m.

For the arrangement diagrammed in FIG. 2, the relationship between $H_L$ at point P (the location of the field sensor in FIG. 1), and P's distance from a dipole of moment m, is found from Cullity's derivation (see B. D. Cullity, *Introduction to Magnetic Materials* (Addison-Wesley, Reading, Mass. 1972) p. 614) as $$H_L = 3m \frac{xG}{(x^2 + G^2)^{5/2}} \quad (1)$$

Figure 3:
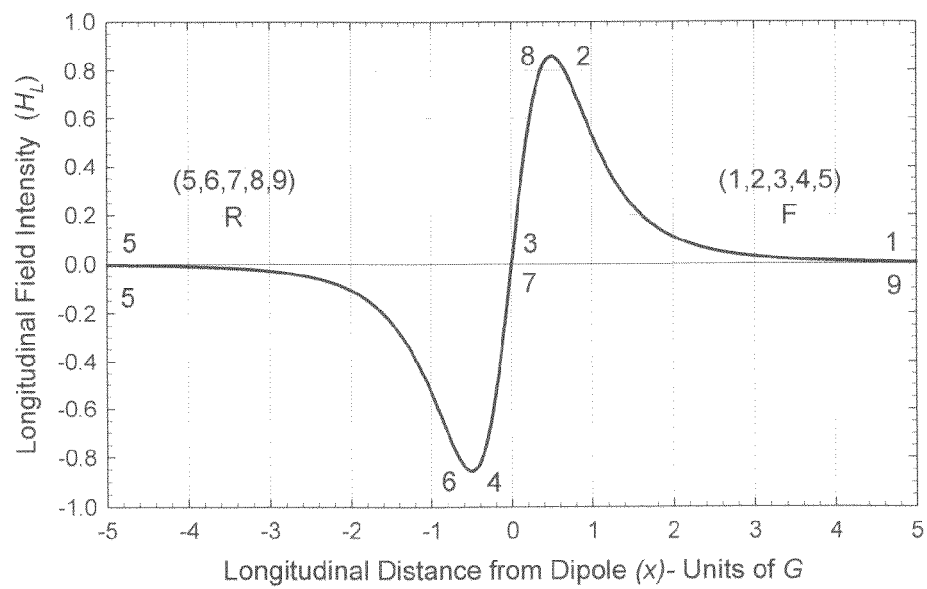
FIG. 3 is a graphical representation of the variation with longitudinal distance x from a dipole of the longitudinal component of the field $H_L$.

The longitudinal component $H_L$ is directed to the right at points to the right of O (x>0) and to the left at points to the left of O (x<0), thus $H_L(x)=-H_L(-x)$ Equation (1) with m=1 and G=1 is plotted in FIG. 3. Note that $H_L$ is symmetrical around the origin, has peak values of ±0.8587 at x=±0.5, and becomes ±0.00435 at x=±5.0. The numbers indicate noteworthy magnet (dipole) positions relative to a field sensor at x=0 during its motion in the forward, F, and reverse, R, directions of motion. When, for example, the magnet is at position 1, $H_{L1}$=−0.00435, at position 2, $H_{L2}$=−0.8587, at position 3, $H_{L3}$=0, etc. Since this field distribution is effectively "attached" to the magnet, it moves together with the magnet. Determination of M(x) requires knowledge of the corresponding M-H relationships for the sample material. Assumption 6, permits suitable, analytically defined M-H functions to be created from modified Langevin functions.

Ascending and descending limbs of hypothetical hysteresis loops are respectively generated from $$M_a = \coth(k(H - H_c)) - \frac{1}{k(H - H_c)} \quad (2a)$$

$$M_d = \coth(k(H + H_c)) - \frac{1}{k(H + H_c)} \quad (2b)$$

wherein the "constants" $H_c$ and k provide means to vary the "coercive field" and "remanence ratio" respectively, thereby to simulate different sample materials. A closed loop is formed by shifting $M_a$ upward and $M_d$ downward by ½ the difference, $\Delta = M_d - M_a$, when H is at its peak value, $H_P$, in equations (2a) and (2b). The loop will then consist of an ascending limb:

$$M_A = M_a + \Delta/2, \quad (2d)$$

and a descending limb:

$$M_D = M_d - \Delta/2. \quad (2e)$$

Hypothetical positive and negative minor limbs from remanence (H=0) to H=±$H_P$ can be produced from $$M_{m+} = M_A + (M_D - M_A)/(1 + f^*H) \quad (3a)$$

$$M_{m-} = M_D + (M_A - M_D)/(1 - f^*H); \quad (3b)$$

where f (<<1), is selected to insure that $|M_m|$ increases continuously with increasing $|H|$ while staying always between $M_A$ and $M_D$.

From the above equations, it is possible to determine $\nabla \cdot M(x) = \varphi$ for the forward and reverse direction $$\varphi_F = \frac{\partial M_{m+}(x)}{\partial x} \text{ and } \varphi_R = \frac{\partial M_{m-}(x)}{\partial x}.$$

Also, $H_F(x) = -\nabla_F(x)$ and $H_R(x)$ can be calculated, and thus D(x).

To avoid the need to deal with equations having ever growing numbers of ever more complex terms, and to provide means for graphically following the evolving analysis, we assign arbitrary (but as will be seen, arguably reasonable) values to the material dependent parameters $H_c$, k, and f, and set $H_P$=15. In this way, $M_A$, $M_D$, $M_{m+}$ (for 0≤H≤$H_P$), and $M_{-m}$ (for 0≥H≥−$H_P$) become numerical functions of H. For similar reasons and to make $H_{LPeak} = H_P = 15$, we assign the value 5/0.8587=17.47 to m in (1).

Figure 4:
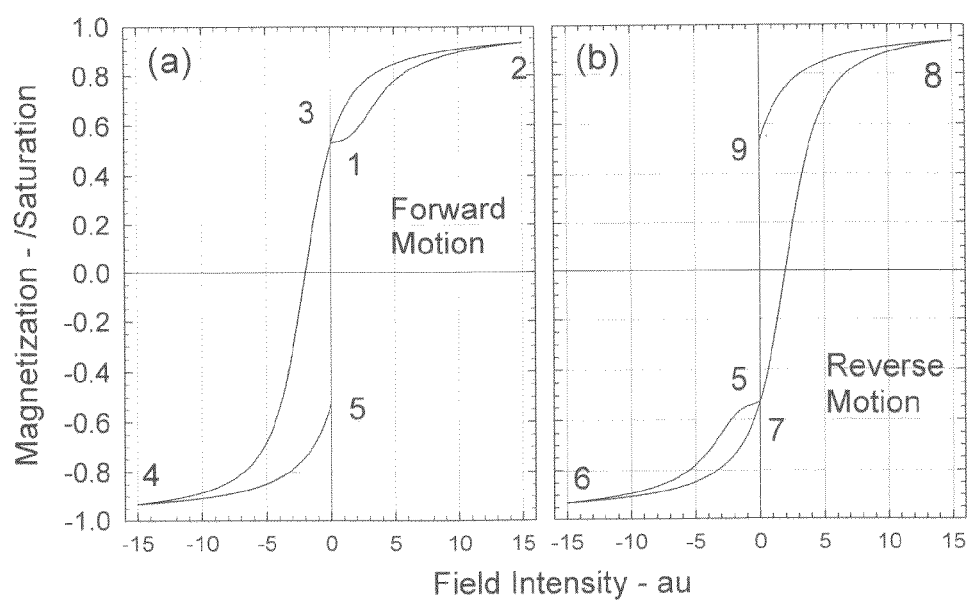
FIG. 4 is a graphical representation of the variation of magnetic field intensity and resulting magnetization at a point on the sample under test which is directly over the field sensor during forward (a) and reverse (b) motion of the magnet.
Figure 5A:
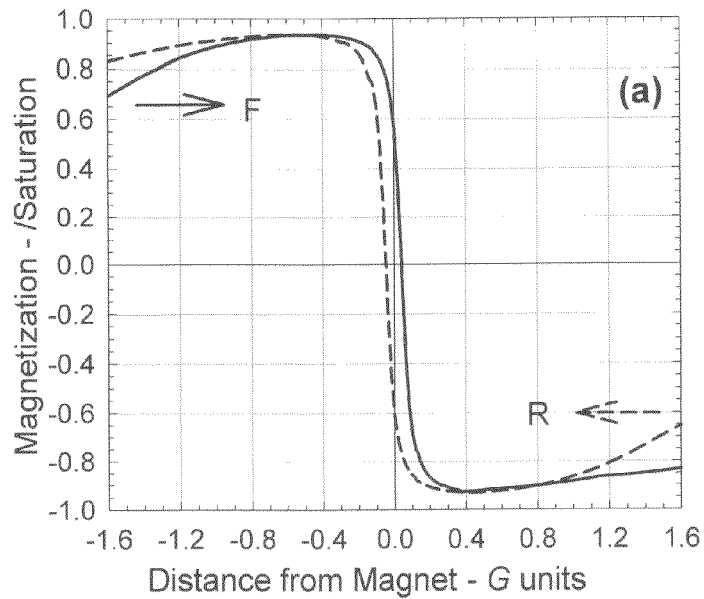
FIG. 5(a) is a graphical representation of the variation of magnetization as a function of distance from the magnet normalized against gap distance G during forward and reverse motion of the magnet.
Figure 5B:
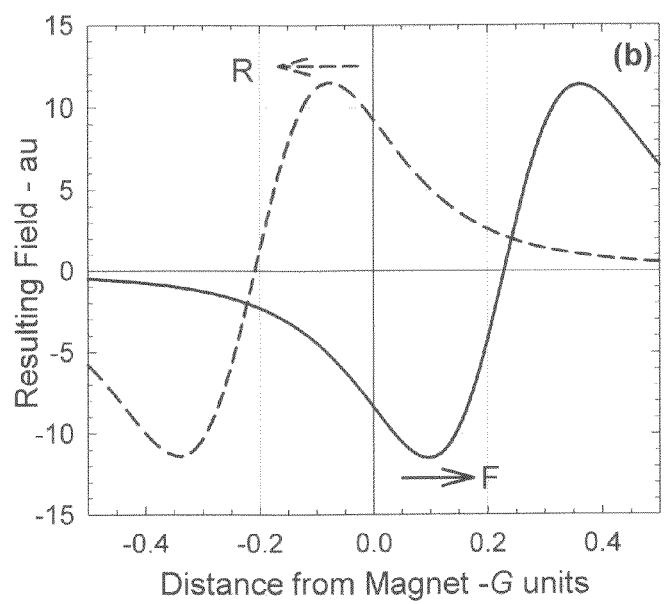
FIG. 5(b) is a graphical representation of the variation of magnetic field arising from the magnetization gradient within the sample at the field sensor position during forward and reverse motion of the magnet.

As the magnet moves forward from x=−5 to x=5, $H_L(0)$ and M(0) will follow the sequence shown in FIG. 4, Plot (a) ($H_C$=2, k=1, f=0.135), and during reverse motion (from x=5 to x=−5), the sequence shown in FIG. 4, Plot (b) ($H_C$=2, k=1, f=0.135). The corresponding variations of $M(0)_F$ and $M(0)_R$ with magnet position are shown in FIG. 5 (a), with the central regions of $\nabla(\nabla \cdot M(0)_F)$ and $\nabla(\nabla \cdot M(0)_R)$ shown in FIG. 5 (b).

Figure 6A:
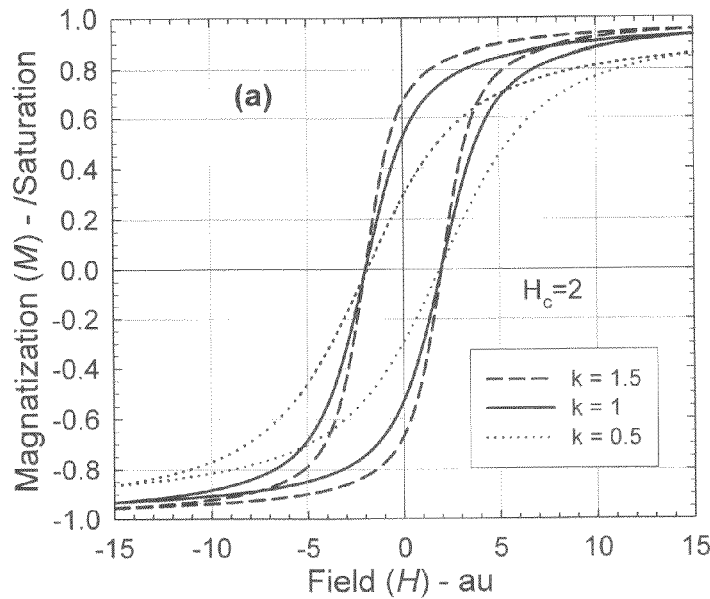
FIG. 6(a) is a graphical representation of the calculated hysteresis loops for the $H_c$ and k values indicated.
Figure 6B:
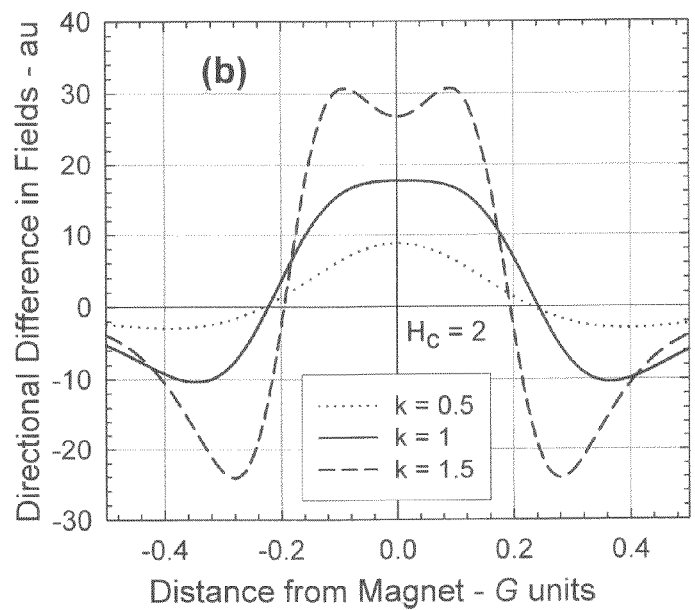
FIG. 6(b) is a graphical representation of the calculated directional difference in sensed magnetic fields D(x) as a function of distance from the magnet normalized against gap distance G for the $H_c$ and k values indicated.
Figure 7A:
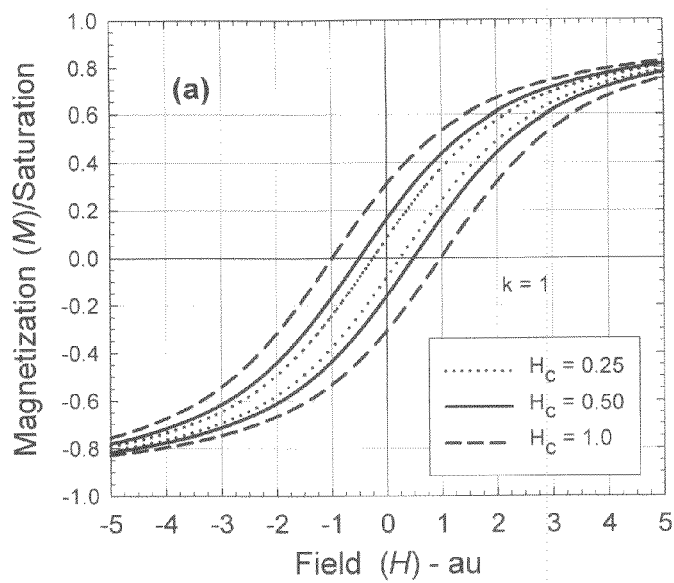
FIG. 7(a) is a graphical representation of the calculated hysteresis loops for the $H_c$ and k values indicated.
Figure 7B:
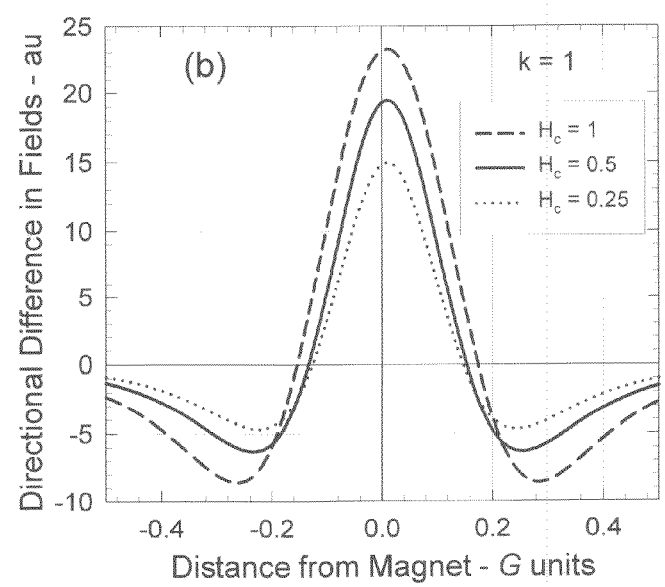
FIG. 7(b) is a graphical representation of the calculated directional difference in sensed magnetic fields D(x) as a function of distance from the magnet normalized against gap distance G for the $H_c$ and k values indicated.

Major hysteresis loops created from (2d) and (2e) for the values of $H_c$ and k indicated are shown in FIGS. 6(a) and 7(a). Resultant values of D(x) are shown in FIGS. 6(b) and 7(b). The sizes of the central positive peak and the symmetrical negative peaks are seen to vary directly with the loop squareness, peak M, and $H_c$, as does hysteresis loss.

EXAMPLE 1

An experimental apparatus was set up on a vertical milling machine, thereby conveniently accommodating a variety of experimental conditions, including SUT size (width, thickness and length), field sensor position relative to the SUT edge, length of Stroke and center position relative to the field sensor, adjustability of both the space between the magnet face and SUT (dimension b in FIG. 1(b)) and the location of the magnet relative to the field sensor centerline. An Allegro 3515 UA Hall effect field sensor (sensitivity=0.0628 mV/A/m), with d (FIG. 1(b))=1.62 mm, was mounted just below (~0.05 mm) the mounting surface of the SUT. Nd—Fe—B magnets of a variety of sizes and energy levels were mounted into aluminum holders having common mounting features (a 9.5 mm diameter×20 mm long cylindrical portion) to allow easy interchangeability in the machine spindle.

Except that the magnet was stationary while the SUT/field sensor combination (being mounted on the milling machine table) were the movable elements, operation of the apparatus followed the aforementioned description wherein the magnet was the movable element.

For each magnet and gap combination, $H_L(x)$ was first measured without any SUT. The comparative amplitudes, ±$H_{LPeak}$ for the various magnet/"gap" (G in FIG. 1(b)) combinations were used to gain understanding on how these parameters affect the later test results. On the basis of the plot of (1) in FIG. 3, together with assumption 2, G was presumed to be the distance between ±$H_{LPeak}$. Measurements of this distance with two or more different physical gaps allowed both the location of the equivalent dipole ("a" in FIG. 1(b)) and the dipole moment to be calculated.

Figure 8:
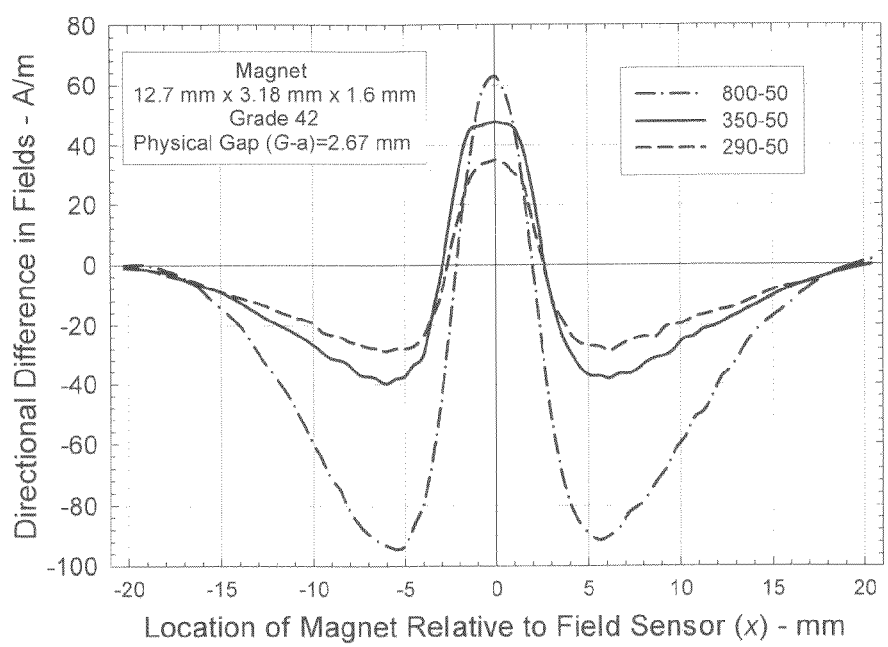
FIG. 8 is a graphical representation of the directional difference in sensed magnetic fields D(x) as a function of distance of the magnet from the field sensor for the three grades of NO Si electrical steel samples and magnet indicated on the plot.
Figure 9:
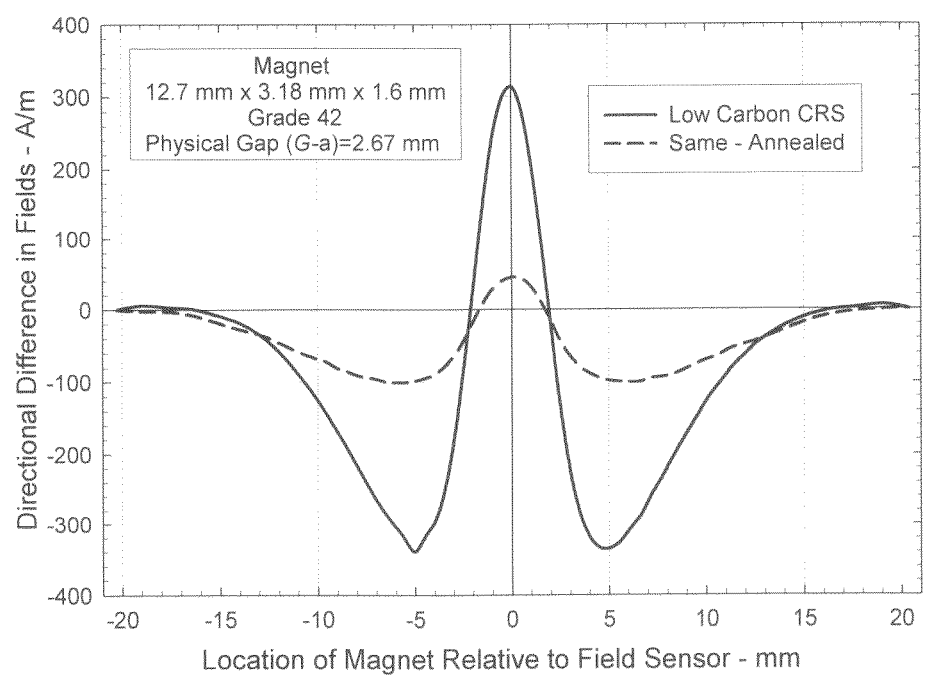
FIG. 9 is a graphical representation of the directional difference in sensed magnetic fields D(x) as a function of distance of the magnet from the field sensor for the low carbon cold rolled and annealed AISI 1010 steel samples and magnet indicated on the plot.

Values of D(x), calculated from measurements of $H_F(x)$ and $H_R(x)$ for the samples and magnet indicated are plotted in FIGS. 8 and 9 as the D(x) signatures of the samples. The most salient features of the plots are seen to match the prediction of the analysis. Moreover, since losses in electrical steels are in approximate proportion to their grade number, and the drastic reduction in coercivity by annealing of cold worked steels is common knowledge, these plots verify the theoretically expected correlation between the amplitude of the signature features and the factors contributing to hysteresis loss.

The versatility of the herein described method was shown by its use to measure the relative losses in regions near the cut edges of strip samples of the 350 and 800 grades. The SUT was placed with the edge being examined ~1 mm over the center of the field sensor. A magnet, 3.18 mm square by 12.7 mm long (in the direction of m) was positioned 1 mm back from the edge and 2.5 mm above the SUT. D(x) measurements on 2 samples each, cut by a fast moving laser averaged 40% (350 grade) and 14% (800 grade) less than those cut more slowly, in good agreement with results from other measurement methods.

The more compact spacing of the signature features predicted in the analysis than those experimentally observed is attributed to several critical but enormously complicating factors being ignored in the analysis; namely the interaction between the magnetization and the generated fields and the gradients in these throughout the SUT thickness. Nevertheless the model correctly shows that the magnetization gradients are different for the two directions of motion, a difference founded on the double valued M-H relationships which manifest "hysteresis".

Both analytical and experimental results convincingly show the signature features of the difference measurements D(x) to be reflective of those same properties of test sample material which are the underlying determinants of the size, shape and intercept features of conventional hysteresis loops. As such, and considering both the rapidity and sensitivity by which D(x) measurements might be obtained with purposefully constructed apparatus of obvious simplicity, it can be seen that the described method is useful for comparative evaluations, by non destructive means, of factors affecting hysteresis loss.

The comparative evaluations contemplated by the present invention are comparisons between a test sample evaluated by the method and sensor of the present invention and a "standard" sample. The latter will be of a predetermined size, orientation, material, treatment history, and the like and will be characterized by measurement of conventional properties either by "standard" means or by having its D(x) signature (or salient features thereof) determined and used as the standard against which the same D(x) features of test samples will be compared. D(x) has non zero values because the sample has non zero coercivity, and the central peak of the D(x) signature has a scaled height which (thickness and other properties being equal) increases with increasing coercivity. This is what makes the method and sensor of the present invention useful. For electrical steels this characteristic alone is sufficient. For mechanical steels, for any given composition, mechanical properties such as strength, hardness, ductility, and perhaps other characteristics, all affect coercivity and, therefore, the height of the central peak in a D(x) signature. Thus, the method and sensor of the present invention have applicability not only for electrical steels, but also for mechanical steels as well.

The method of the present invention desirably utilizes means for sensing and converting sensed magnetic field intensities H(x) and sensed distances x between magnet and field sensor and data acquisitions for processing the sensed data into useful forms, such as graphical plots. Position x is determined from an incremental linear encoder. The specific encoder used was a Heidenhain-LIDA 403 Series with a Model 489 Scale. This is an optical (rather than magnetic) device which provides electrical pulses on two channels for every 4 microns (4 micrometers=0.00015478 inches) of travel. The distance between corresponding pulses on each channel is significantly less than 4 microns. These pulses are fed into a "counter" circuit within a National Instrument USB-6210 Bus-Powered M Series Data Acquisition Unit (DAQ). If during motion in one direction the channel A pulse precedes the channel B pulse, the counter increments; if the channel B pulse precedes the channel A pulse, the counter decrements. Thus, as long as power to both the encoder and the DAQ have not been interrupted, the "count" represents a location (i.e., the "x" value) accurate to within 4 microns. This encoding system is called "quadrature" counting.

The magnetic field is at all times being measured by an Allegro Model 3515 UA Hall Effect Integrated Circuit. This device provides a DC output voltage of (nominally) 2.5 V in zero field. Fields of one polarity cause this voltage to increase at the rate of 5 mV/Oe, opposite polarity fields cause a decrease at the same rate. The output signal of this device is connected to one terminal of a differential pair on the same DAQ as the counting signals. The other terminal of this differential pair is connected to the center of a pair of equal sized resistors which are connected to the same 5 V power supply as is used to power the Hall Effect Device. Thus, if the field at the field sensor=0, the differential input to the DAQ=0.

The DAQ is connected to a USB port of a computer within which National Instrument LABVIEW software is installed. This software is configured to sample the differential input voltage (a measure of the field) each time it receives a pulse at the Channel A input terminal.

At the beginning of an experimental run, the counter is set to zero at a known distance from the x=0 position. This is the point where the field from the magnet alone (no ferromagnetic sample present) crosses zero). After motion starts in the "forward" direction and the counter increments to "1" the signal from the field sensor is acquired and stored. When the counter increments to "2", the signal from the field sensor is again acquired and stored. This process, wherein a field signal is acquired and stored at each increment of position, is continued until the desired stroke is completed. The motion is stopped. Due to the absence of triggering pulses, no further data is acquired. When motion is started in the reverse direction, it is first recognized by a pair of position pulses having opposite phase to that seen during forward motion, at which time the counter decrements, and a field signal is acquired. This continues until the counter reaches its starting position (counter indicates 0) and the motion is stopped.

The computer has acquired four sets of numbers: 1—the count during forward motion (beginning with 1, and ending at the end of the stroke); 2—corresponding values of the magnetic field signal; 3—the count during reverse motion (ending at 0); 4—corresponding values of the magnetic field signal. This data is sent to each of 4 appropriately titled columns in a scientific graphing software (Sigma-Plot) in the same computer. The columns of data are appropriately aligned, converted to engineering units ("position relative to magnet" in mm, i.e., x), and field in Oersteds or Amperes per meter. D(x) is calculated and graphs are made containing whatever plots are desired with whatever legends and conditions of experiment information are deemed to be needed.

For all except samples thinner than ~0.05 mm, points within interior cross sections vary sufficiently in distance from the PM, the FS, and the sample surfaces, to experience, and become sources of, significantly different field amplitudes and distributions. To the extent that the sources of magnetic hysteresis properties within any cross section have inhomogeneous and asymmetrical distributions, interchanging the sample surfaces nearest to the PM and FS will result in different D(x) signatures. The hysteresis comparator sensor can thus serve as a tool to detect the presence and extent of these property gradients, whether due to composition, microstructure or residual stress. The hysteresis comparator sensor has potential applications for examining materials for structural changes due to fatigue or radiation, to check for uniformity of grain size and orientation, and to compare the constancy of results of surface modification processes, as will be seen from the results presented herein of measurements on samples having obvious gradients in composition, microstructure or residual stress.

Figure 10:
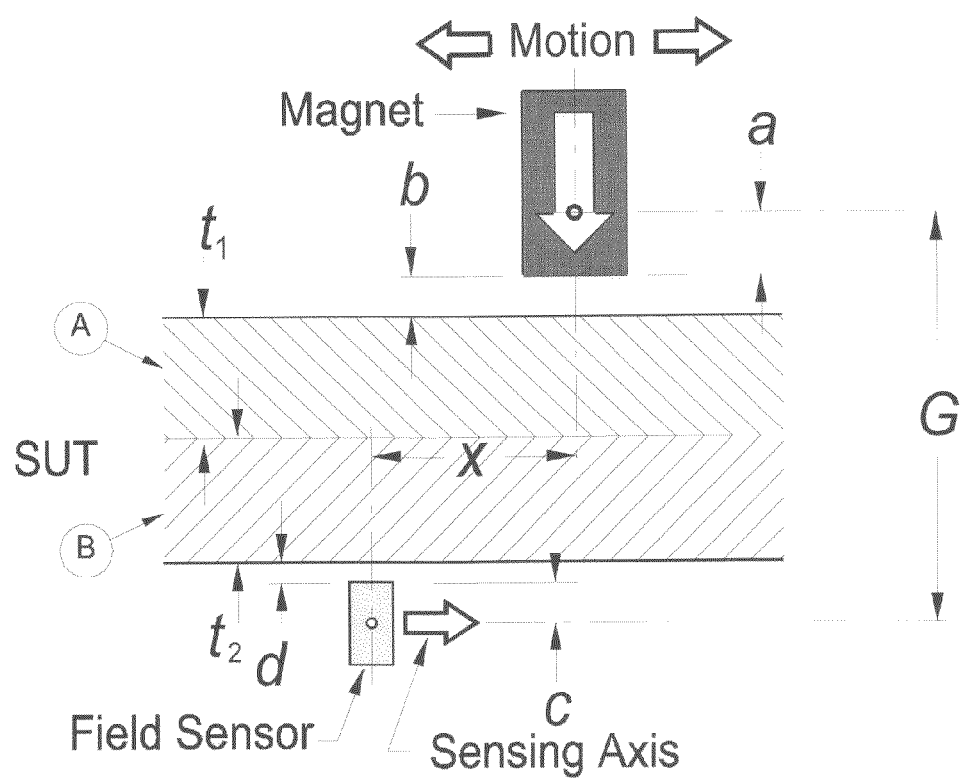
FIG. 10 is a schematic representation showing the basic arrangement of active elements of the magnetic, non-contacting hysteresis comparator sensor of the present invention, showing the dimensional features thereof, where the SUT is comprised of two zones, A and B, with zone A disposed above zone B.

A relatively simple phenomenological model suffices to demonstrate the basis for the orientation dependence of the D(x) signatures of samples having asymmetrical magnetic property gradients. The type of inhomogeneity being considered is readily understood by considering the SUT to be comprised of 2 portions, identified in FIG. 10 as A and B, with A above B. While both A and B are individually homogeneous, they differ from each other in ways which affect their respective coercivities, e.g., composition, microstructure, residual stress. Thus either A or B may be designated as the magnetically harder (H) portion (greater coercivity) or softer (S) portion (lesser coercivity) without regard to underlying cause(s). If, in what follows, portion A is the harder material, the SUT orientation will be designated as H/S, whereas if portion B is harder, the orientation will be designated as S/H. Although both A and B are indicated in FIG. 10 to have finite thicknesses ($t_1$ and $t_2$ respectively), for present purposes it is assumed that the magnetizations and fields within each, while varying with longitudinal position relative to the PM, are constant within any cross section of either. The difference in D(x) signatures for the S/H and H/S orientations is postulated to derive in the first instance from the inversion in the respective proximities of the S and H portions to the PM and FS. It should be recognized that in the absence of property differences between the A and B portions of the SUT, as would exist in samples characterized in the above described scheme as H/H or S/S, D(x) would be unaffected by interchanging the surfaces closest to the PM and FS of either such sample. The consequences of inverting S/H and H/S samples need to be examined in more detail.

The longitudinal field at the FS has 3 components: the field from the PM ($H_M$) and the fields arising from the longitudinal magnetization gradients in the A portion ($\nabla \cdot M_A$) and in the B portion ($\nabla \cdot M_B$). Unlike the latter two sources, $H_M$ is assumed to be independent of the presence and properties of the SUT and, thereby, also to be independent of the direction of motion. The field distribution, even close to a small PM, has been shown in the prior discussion of the hysteresis comparator sensor to be approximated closely by the field from a dipole having the same magnetic moment (m), situated within the PM, some distance a from its active face (see FIG. 10). Since this field is the originating source of the SUT magnetization (hence also of the fields arising from the divergence thereof), it is important to appreciate the range of its variation with longitudinal (x) and normal (G) distances from the equivalent dipole. For a magnet having a dipole moment m, the longitudinal field intensity, $H_L$ is found (for positive values of G) from (see [0051])

$$H_L = 3m \frac{xG}{(x^2 + G^2)^{5/2}} \quad (1)$$

Figure 11:
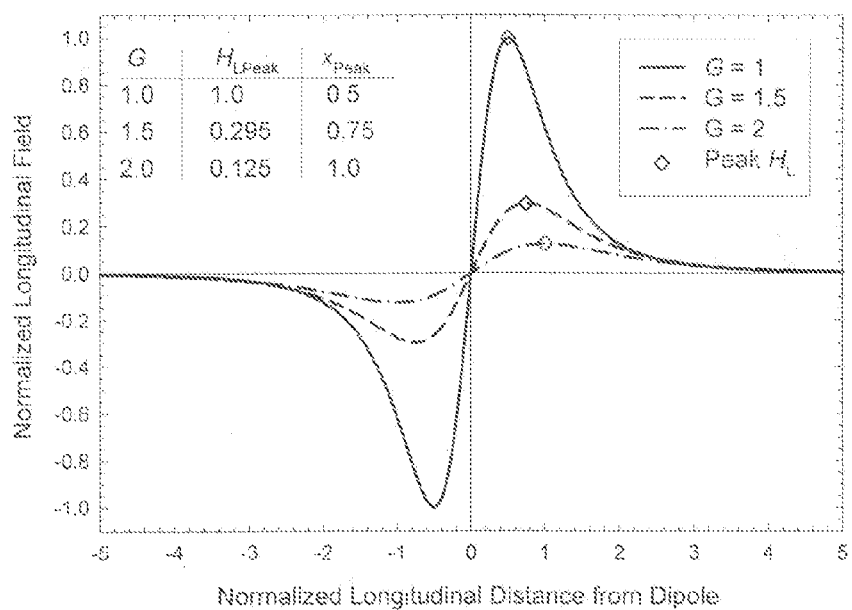
FIG. 11 is a graphical representation of normalized longitudinal magnetic field intensity as a function of normalized longitudinal distance from the magnetic dipole.

From $\partial H_L/\partial x = 0$, the peak intensities of $H_L$ are found to be located at $x = \pm 0.5$ G. Inserting these values of x into (1), the peak amplitudes are found to be $\pm 0.8587$ (m/G³). Plots of (1), normalized against m=1 and 0.8587, for the values of G indicated are shown in FIG. 11.

The properties and thicknesses of the materials comprising the A and B portions of the SUT, the moment (m) and dimensions of the PM, and dimensions b and d in FIG. 10 comprise a "measurement arrangement". In usual measurement arrangements of homogeneous samples, d≈0, the magnet is selected to have sufficient m, and b is made small enough, such that for the range of materials being examined, the peak magnetization stays close enough to technical saturation that modest (<0.5 mm) changes in b do not cause significant (>5%) changes in coercive force and thereby in the D(x) signature.

This may seem difficult to obtain since the peak intensities of the PM field are seen to vary inversely with G³ [≡(a+b)³] in the hysteresis comparator sensor]. Increasing G, however, also increases the distance between the positive and negative peak intensities which leads to an increase in the distance between the regions of peak magnetization within the SUT. This diminishes the "demagnetizing factor" of the magnetized region within the SUT, and helps to offset effects of the reduced field intensity when b is increased. These tendencies toward self compensation also act when b is decreased, although peak magnetization is ever less dependent on field intensity as saturation is approached.

In the contemplated measurement arrangement, wherein the D(x) signatures for the H/S and S/H orientations are being compared, the d distances of the H and S portions are interchanged when the SUT is inverted. The field source $\nabla \cdot M_A$ is obviously further from the sensor (by $t_2$) than the field source $\nabla \cdot M_B$. Thus the sensitivity to $\nabla \cdot M_A$ is less than to $\nabla \cdot M_B$ regardless of the H/S or S/H orientation. The magnetizations within each portion of the SUT, hence also their gradients, are the result of the local effective field, which like the sensed field, has 3 components, two of which both interact and are hysteretic.

Unlike the situation with a single dimensionless dipole, the exact nature of the relation between field intensity and normal distance from a magnetized body cannot be expressed by an analytical expression analogous to (1). The magnetization therein varies from large positive to equally large negative values within typical distances of ~6-20 mm and the magnetized region is confined to a thin strip extending widthwise of the SUT surrounded by non magnetized material having significant, but uncharacterized, permeability. While the internal field $H_{in}(x) = \nabla \nabla \cdot M(x)$ and fields on both sides of a surface are the same, the determination of M(x) is beyond the scope of this work. For the purposes here it is sufficient to assume that the sensed field will vary inversely with $(d+c)^3$. Since for the FS devices typically employed, c≈1.6 mm, the sensitivity at d=0.5 mm will be reduced to 44%, and at d=1 mm to 23% of its value at d=0.

Finally there is the interaction between the fields from each of the sources, $\nabla \cdot M_A$ and $\nabla \cdot M_B$, and each other's magnetization. Once again it is only necessary to understand that these will be different for the two possible orientations of the composite sample.

Thus armed with the understanding of why the D(x) signatures from the two orientations of a sample comprised of A and B portions having dissimilar magnetic properties will differ, we turn to the following Example 2 to illustrate the potential applications of the hysteresis comparator sensor.

EXAMPLE 2

Samples of 3 distinctive material groups were prepared for testing. The groups were selected to allow the construction of composite samples having closely related (metalurgically speaking) A and B portions. Each group was comprised of pairs of samples having each of 2 significantly different coercivities. There were thus, 12 samples total.

An electrical steel group consisted of 2 samples each of 0.5 mm thick NO grades 350-50 and 800-50. The coercive force difference between these two materials derives from their compositional difference, principally in Si content (350–2%, 800–1.3%) which affects coercivity primarily by altering the crystal anisotropy.

A low carbon steel group included 2 samples each of 0.61 mm thick AISI 1010 steel in cold rolled and annealed conditions. The coercive force difference of these two materials derives principally from their different densities of dislocations and associated microstress distributions An alloy steel group consisted of 2 samples each of 0.79 mm thick SAE O-1 tool steel (0.95C, 1.2Mn, 0.4Si, 0.5Cr, 0.5W, 0.2V, bal Fe) in quenched and tempered, and annealed conditions. The coercive force difference between these two materials derives from their respective microstructures. The annealed samples have ferrite structures, whereas the thermally hardened samples are composed of martensite.

The carbon steel and tool steel samples were all 25.4 mm wide, and 114 mm long. The electrical steel samples were 30 mm wide and 300 mm long. All samples had two 4 mm diameter holes 94 mm apart, centered on their widths to allow for fastening with brass screws to the test apparatus.

Composite test samples were prepared by combining 1 each of the 2 different samples in each group. Tests were also conducted with composite samples comprised of 2 identical samples of each kind from each group. Measurements were conducted in the apparatus of FIG. 10, modified to allow clamping of the SUTs to a flat mounting surface with an aluminum clamp plate having a central slot somewhat wider than the magnet holder.

A test consisted of first bringing the PM to the required distance from the SUT surface, then running it forward and back over a stroke of 40 mm two times to stabilize the magnetization cycling. During the next forward and back motions the output signal from the field sensor (Allegro 3515 Hall Effect IC mounted to be flush with the bottom surface of the SUT in the center of the stroke) together with magnet position x relative to the FS were recorded. The difference, $D(x)$, in field sensor signals obtained during forward and back motions, converted to A/m units was plotted against x for each composite sample. The results of these tests are shown in the following FIGS. 12-14.

Figure 12:
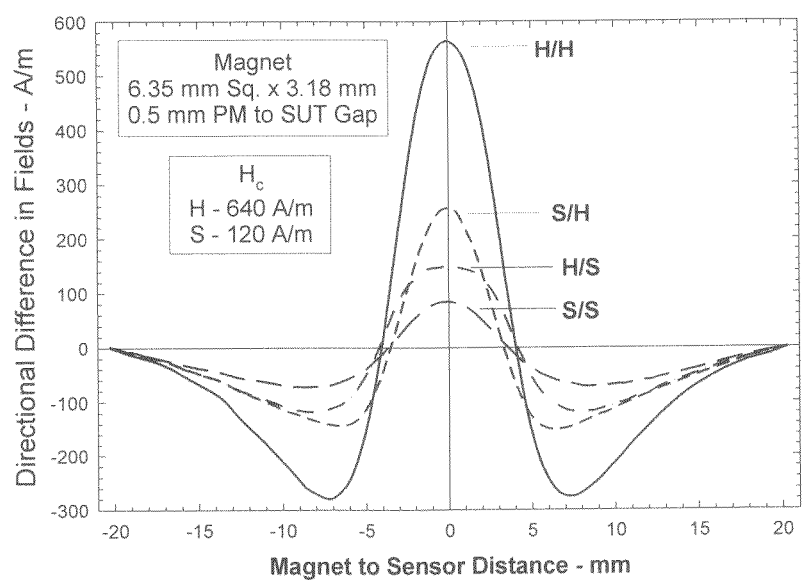
FIG. 12 is a graphical representation of the directional difference in sensed magnetic fields D(x) as a function of distance of the magnet from the field sensor for the cold rolled (H) and annealed (S) composite samples of AISI 1010 low carbon steel and magnet indicated on the plot.

Looking first at the plots in FIG. 12, one is not surprised to find the largest and smallest central peaks to be obtained with the homogeneous H/H and S/S samples respectively. It should be noted that the ratios of their peak values: 565/84=6.7, of their high peak to low peak values: 843/158=5.4, and of conventionally measured $H_c$ (coercive force of single H and S samples): 640/120=5.3 are, considering the widely different measurement conditions and methods, clearly comparable. The intermediate positions of the S/H and H/S plots and the fact that they are different from each other and have peaks which are different from (in this case smaller) the average of the $D(x)$ peaks of the H/H and S/S samples, support the understanding developed in connection with EXAMPLE 1.

Figure 13:
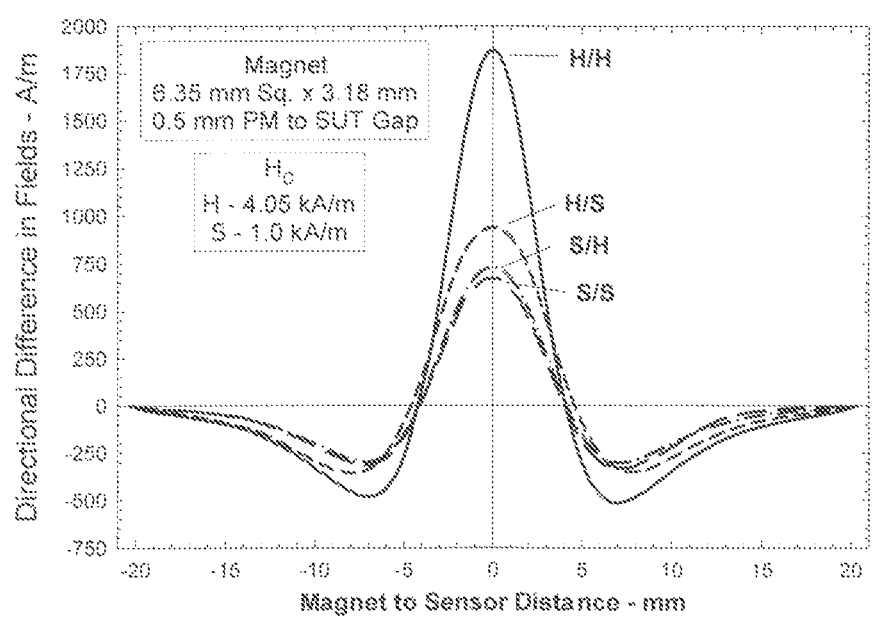
FIG. 13 is a graphical representation of the directional difference in sensed magnetic fields D(x) as a function of distance of the magnet from the field sensor for the quenched and tempered (H) and annealed (S) composite samples of SAE O-1 tool steel and magnet indicated on the plot.

The H/H and S/S plots in FIG. 13 also respectively exhibit the largest and smallest peak $D(x)$ values. The peaks of the H/S and S/H plots also have intermediate values, although they are seen to have reversed relative positions from those in FIG. 12. Nevertheless, they are different from each other and from the average of the peak values of the H/H and S/S samples (again, both are smaller). The ratio of the peak values of the H/H and S/S plots (1870/670=2.8) is now significantly smaller than that of their $H_c$ ratio, viz. 4.05/1=4.05. This suggests that the use of a stronger magnet might result in higher peaks. It should be noted that these samples are both harder (by nearly an order of magnitude) and thicker than those used to obtain FIG. 12.

Figure 14:
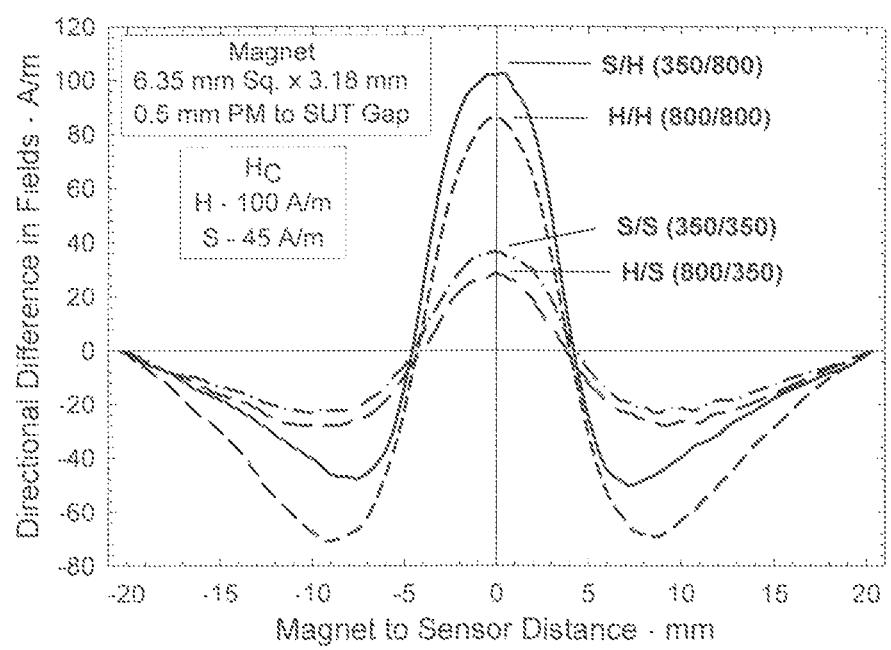
FIG. 14 is a graphical representation of the directional difference in sensed magnetic fields D(x) as a function of distance of the magnet from the field sensor for the 800 (H) and 350 (S) grade composite samples of NO Silicon steel and magnet indicated on the plot.

The relationship among the peak values of the plots in FIG. 14 differs markedly from those in FIGS. 12 and 13. The H/H and S/S samples no longer have the highest and lowest peak values, nor do any of the measured peaks come close to the average of the highest and lowest. The height of the peaks seems dominated by the relative magnetic hardness of the portion which is closest to the FS. Thus the highest peak occurs for the S/H sample, and the smallest peak for the H/S sample. The ratio of the peak values of the homogeneous samples, i.e., the H/H and S/S plots (86/37=2.32) is seen to correspond closely with that of their respective $H_c$ values, viz. 100/45=2.22.

The basis of the ability of the hysteresis comparator sensor to detect gradients in coercivity deriving from compositional, microstructual and residual stress inhomogeneity is demonstrated by this Example 2. Informative experimental results with materials having a 2 order of magnitude range in coercivity and 150% range of thicknesses using the same magnet at the same distance from all of the samples attests to the versatility of the method. Unlike global measurements of inhomogeneous samples, which return volumetric averages of the magnetic properties, this method exposes the sample to fields which diminish with distance from one surface. It is thereby endowed with a unique ability to determine gradients in the properties which influence the measurement. The variation in details among these results attests to the fact that more than a single factor is at work.

Critical to the development of a fundamental model for explaining the phenomena underlying the operation of this new non-destructive testing technology were the assumptions that the sample under test (SUT) had no significant thickness and that the only field influencing its magnetization was that from the moving magnet. While, as has been seen, this model successfully predicts the experimentally observed "signature" shape of plots of $D(x)$, as well as the dependence of maximum and minimum values of $D(x)$ on the intercept features (coercive field and remanence) of the SUT material's major hysteresis loop, it inherently ignores possible effects of sample thickness on $D(x)$ measurements. Sample thickness, as will be seen, has an understandable effect on the field sensed by the field sensor.

Figure 15:
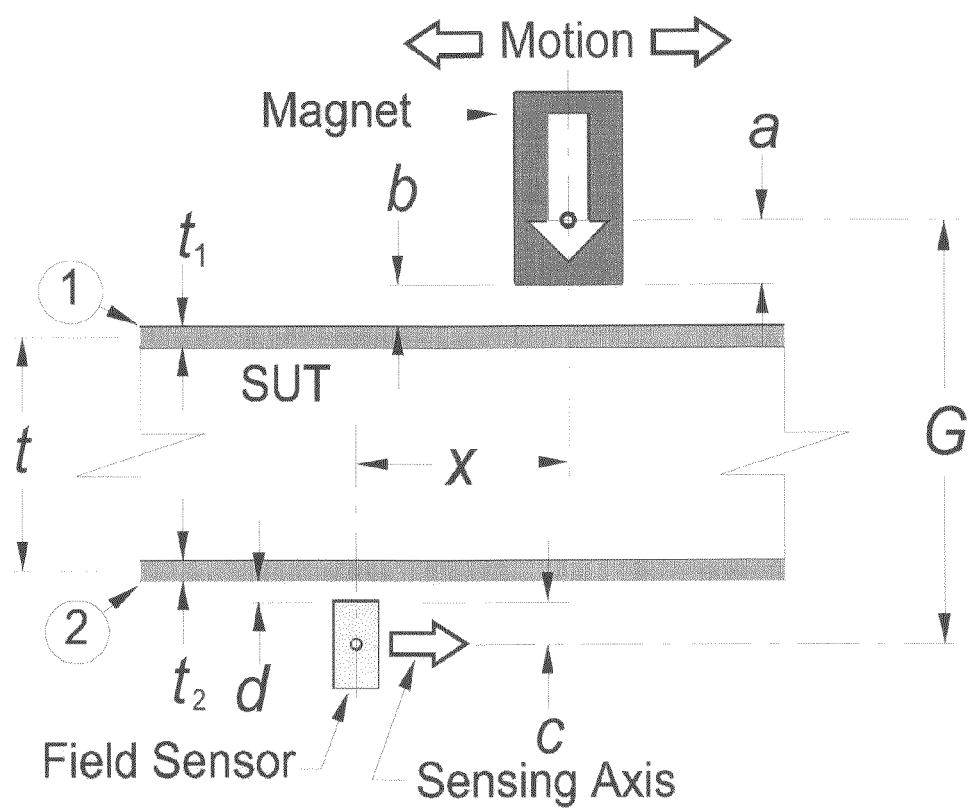
FIG. 15 is a schematic representation showing the basic arrangement of active elements of the magnetic, non-contacting hysteresis comparator sensor of the present invention, showing the dimensional features thereof, where the SUT of finite total thickness t is comprised of two separated layers, with respective thicknesses of $t_1$ and $t_2$.

Referring to the arrangement illustrated in FIG. 15, wherein an SUT of finite total thickness, t, is comprised of two separated layers, with respective thicknesses of $t_1$ and $t_2$, each of which, while also finite, are thin enough to consider that the fields from all sources, while obviously varying with x, are effectively uniform (say within 1%) over any cross section. We ignore as irrelevant all but the longitudinal components of the fields from all sources and use the term "field" to mean its longitudinal component.

It is convenient to identify field components by both their sources and locations. Thus $H_{M1}(x)$ refers to the field from the magnet within the top layer (layer 1) and indicates that (for all other dimensions in FIG. 15 remaining constant) it is a continuous function of longitudinal distance x from the magnet centerline (i.e., the location of the "equivalent" dipole) to the measurement point. Similarly $H_{12}(x)$ indicates the field (at distance x) within layer 2 (the bottom layer), arising from the magnetization divergence within layer 1 ($\nabla \cdot M_1$). The fields acting at the sensor location are thus identified as $H_{MS}(x)$ (from the magnet), $H_{1S}(x)$ (from $\nabla \cdot M_1$), and $H_{2S}(x)$ (from $\nabla \cdot M_2$). It is important to appreciate that once the layer materials are selected and the arrangement of FIG. 15 is assembled, all of these fields are effectively "attached" to the magnet. Thus, while their individual spatial distributions and peak amplitudes in layer 1, in layer 2, and at the field sensor are all different, the characterizing features (polarity and intensity) of each, and hence their resultant "effective" field, at any point within our range of interest, are determined solely by the location of the magnet along its fixed path and the direction of motion.

$H_M$, at all locations, is assumed to be independent of variations in the permeance of the flux closure paths, whether due to sample thickness, distance from the magnet, or the direction of magnet motion. Thus $H_{M1}(x)$, $H_{M2}(x)$, and $H_{MS}(x)$ are all independent of both the properties of the SUT material and of the direction of magnet motion. In contrast, $H_{11}(x)$, $H_{12}(x)$, $H_{1S}(x)$, $H_{21}(X)$, $H_{22}(x)$, and $H_{2S}(x)$ are not only fundamentally linked to the susceptibility (a function of the sample material, the instantaneous local effective field, and the history of its variations), but are clearly both interdependent and interdependent functions of x.

With these understandings, together with those developed herein from the fundamental model for a single layered (therefore unnumbered) SUT (wherein it was shown that $D(x)=H_{FS}(x)-H_{RS}(x)$, wherein "F" and "R" refer respectively to "forward" and "reverse" motions, and wherein (and distinct for each direction of motion) $H_S=-\text{grad } \phi$ (for a sensor at zero distance from the sample surface), and wherein $\phi=\nabla\cdot M$, ($\phi$ being the uncompensated pole density), and wherein $M=f(H_M)$, wherein f is a double valued, i.e., hysteretic, function, and wherein $H_M(x)=3mxG/(x^2+G^2)^{5/2}$, wherein m is the dipole moment of the magnet and G is the "gap" between the dipole location and the SUT), it becomes possible to predict the relative effect of sample thickness on the sensed field at all magnet locations visited during either forward or reverse motions. It becomes obvious, for example, that in the absence of magnetized matter between the magnet and the field sensor, i.e., $t_1=t_2=0$, the magnet is the sole field source; hence since $H_{FS}(x)=H_{RS}(x)=H_{MS}(x)$, $D(x)=0$ for all values of x.

If $t_1=0$, but $0<t_2<<(c+d)$, a new field component, $H_{2S}(x)$, will appear at the sensor, and since, due to hysteresis, $H_{F2S}(x)\neq H_{R2S}(x)$, at least within some range of (x), finite values of $D(x)$ will be found. If now, the sample at layer 2 is replaced by one (of the same material), having a thickness twice as large as previously specified, but still thin enough to meet the defining criteria, (within which $M(x)$ is effectively uniform over any cross section), neither $M(x)$, $\nabla\cdot M(x)$, $\phi$, nor grad $\phi$ (the resulting internal field $H_{22}(x)$) will be altered during either direction of magnet motion. On the other hand since the field at a distant location is proportional to the gradient in the number of uncompensated poles, not in the gradient in their volume density, and, for the same density, $\phi$, the number of poles is directly proportional to the sample thickness, the magnitudes of $H_{F2S}$, $H_{R2S}$, and $D(x)$ will now each be twice what they were with the originally contemplated $t_2$ thickness. Following this same reasoning, it is clear that for a layer 2 sample having only half the thickness of the one originally contemplated, the magnitude of $D(x)$ will also be found to be reduced by half. Thus within the range of thicknesses meeting the described criteria, $0<t_2<<(c+d)$, it is expected that $D(x)$ will be linearly proportional to $t_2$.

Suppose now that a second thin layer $t_1$ is introduced as indicated in FIG. 15 and that, although within $t_1$ the effective field $H_{e1}(x)$ and hence $M_1(x)$ are effectively constant over any cross section, the peak values of $H_{M1}$ will clearly exceed those of $H_{M2}$. Since the polarities of the $\nabla\cdot M$ fields within each layer always act to reduce their respective magnetizations, (i.e., they are "demagnetizing" fields) it should be clear that $H_{12}$ (being for most values of x, opposite in polarity to $H_{M2}$) acts to reduce $M_2$, $\nabla\cdot M_2$, $\phi_2$, $H_{22}$ and, most significantly, $H_{2S}$ for both directions of motion. Since $H_{21}$ is clearly smaller than $H_{12}$, it has relatively lesser reducing effect on $H_1$. While $H_{11}$ is significantly larger than $H_{22}$, being that layer 1 is much further from the sensor than layer 2, $H_{1S}$ can expectedly be less than $H_{2S}$ was before the addition of layer 1. As a result, $D(x)$ is decreased by the insertion of layer 1.

Making either layer thicker, inserting another layer between layer 1 and layer 2 and making it thicker, or other ways of realizing a single sample of significant thickness t, can be seen to hasten the further reduction of $D(x)$. Once, following the process outlined above, the decrease in $D(x)$ with increasing thickness starts, it will continue until either $H_{FS}$ and $H_{RS}$ both vanish, or $H_{FS}=H_{RS}$.

Figure 16:
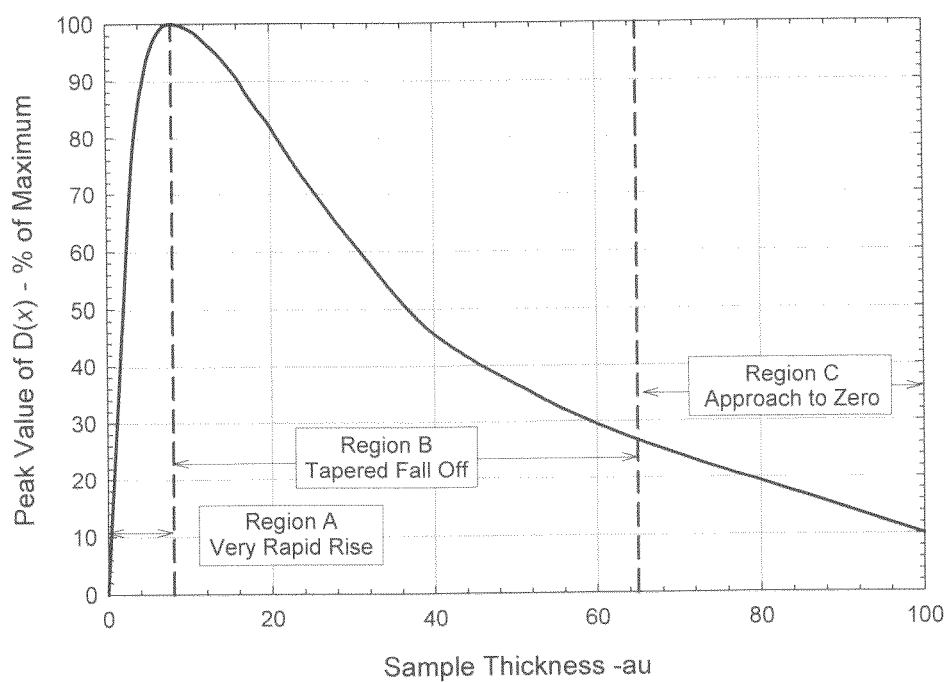
FIG. 16 is a graphical representation of the peak value of the directional difference in sensed magnetic fields D(x) as a function of sample thickness.

The existence of finite values of $D(x)$ derives in the first instance from hysteresis in the $M(H)$ characteristics in the sample material. As the thickness increases, the field excursions within the material furthest from the magnet become smaller and smaller, the normally sigmoidal hysteresis loop becomes ever more lenticular, formed in fact by two parabolas wherein the largest slopes have moved from the coercive points to the limb ends. Magnetization gradients are also reduced by the continuous increase in the distance between the field peaks with increasing distance from the magnet. Nevertheless, while $\nabla\cdot M$ gets ever smaller with increased thickness, the model described above fails to indicate that $D(x)$ will actually become zero. In consideration of the foregoing, dependence of $D(x)$ on SUT thickness can be expected to vary differently in three regions as illustrated in FIG. 16.

Region A—The initial appearance and steep, approximately linear growth in $D(x)$ with increasing thickness manifests the presence of ever more hysteretic material in closely the same location relative to the magnet and the field sensor. The magnitude of the peak value reflects the principal characterizing features of hysteresis: coercivity and remanence.

Region B—The fall off in $D(x)$ with further increase in thickness manifests the growth in interaction between material closest to the magnet and that closest to the field sensor. The fall off starts haltingly as this process competes with further growth from the Region A process. As initially thin samples are replaced by thicker ones the magnetization and its gradients in material closest to the sensor are reduced by "demagnetizing fields" from the material closer to the magnet. The resulting decrease slows with increasing thickness since a same size addition in thickness is a smaller portion of the whole.

Region C—The seemingly steady rate of fall off in $D(x)$ with thickness manifests the increase in volume of material wherein the hysteresis and remanence are rapidly diminishing. Whether $D(x)$ approaches zero asymptotically or actually disappears at a finite slope at a finite thickness is not predictable from this model.

EXAMPLE 3

Test samples of three types of steel, having a range of thicknesses starting from the lowest thickness indicated in the below chart, were gathered for testing. To achieve greater thicknesses of each type of steel, stacks of thinner samples were assembled. Thus, samples of Type A thicker than 0.635 mm were comprised of stacks of 2-4 thinner samples. Samples of Type B were 1, 2, 3, 8, 12 and 16 times the thickness of the thinnest sample. Samples of Type C were comprised of stacks of 1, 2, 3, 4, and 5 individual samples, each 0.5 mm thick. The samples were tested in a hysteresis comparator sensor as in EXAMPLE 2 utilizing a Nd—Fe—B magnet which was 6.35 mm sq.×3.18 mm with a gap G of 0.5 mm

| Group | Material | Type | Condition | Thickness Ranges |
|-------|----------|------|-----------|------------------|
| A | AISI 1095 | High C Steel | Q & T - RC 48/62 | 0.0254-1.981 mm |
| B | SAE O1 | Tool Steel | Q & T - RC 55/62 | 0.397-6.35 mm |
| C | 800-50 | NO Elect. Steel | Fully Processed | 0.5-2.5 mm |

Figure 17:
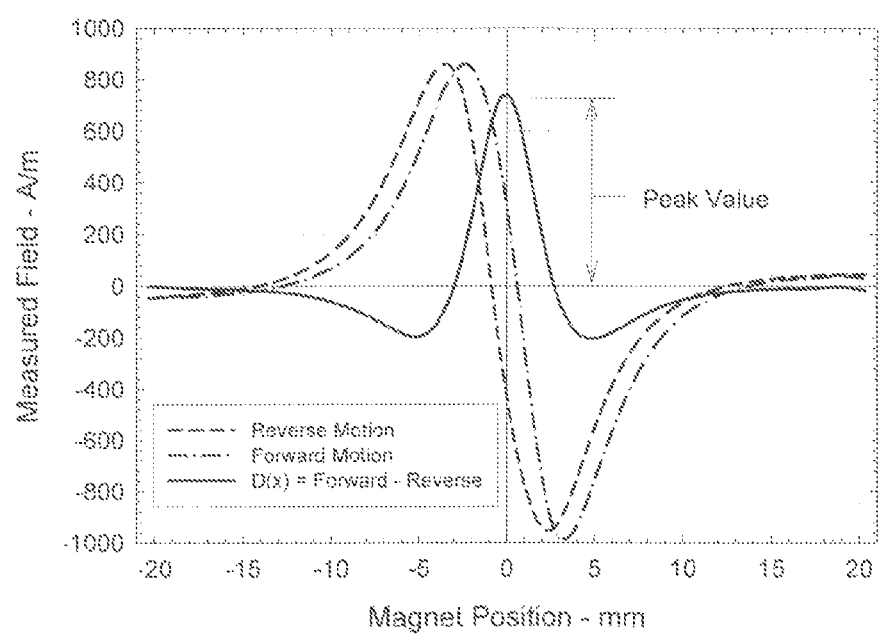
FIG. 17 is a graphical representation of the measured magnetic field as a function of distance of the magnet from the field sensor during both forward and reverse motions and of the directional difference in sensed magnetic fields D(x) as a function of distance of the magnet from the field sensor.
Figure 18:
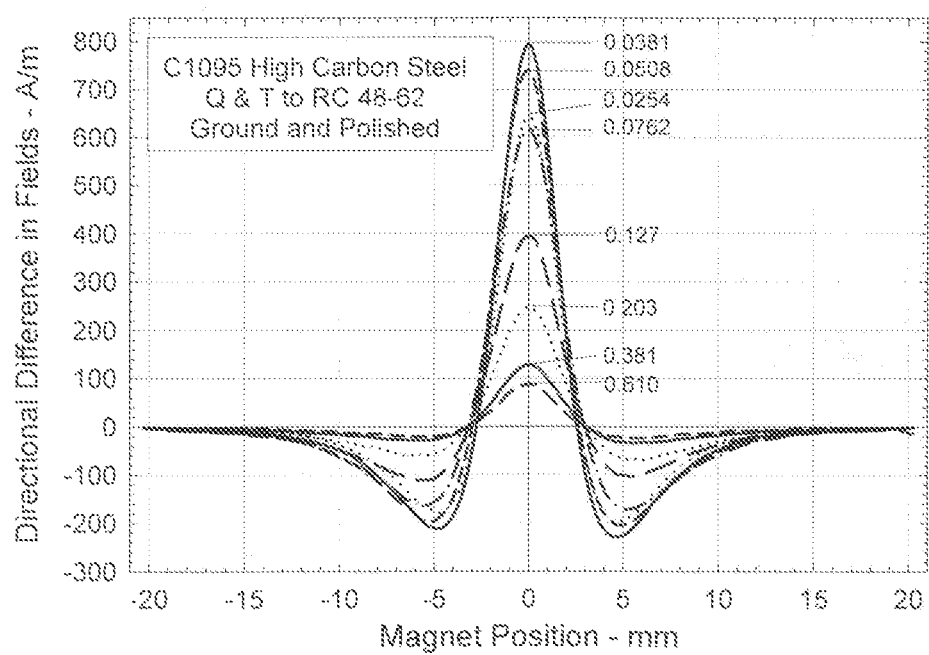
FIG. 18 is a graphical representation of the directional difference in sensed magnetic fields D(x) as a function of distance of the magnet from the field sensor for samples of C1095 high carbon steel having the thicknesses indicated in the plot.
Figure 19:
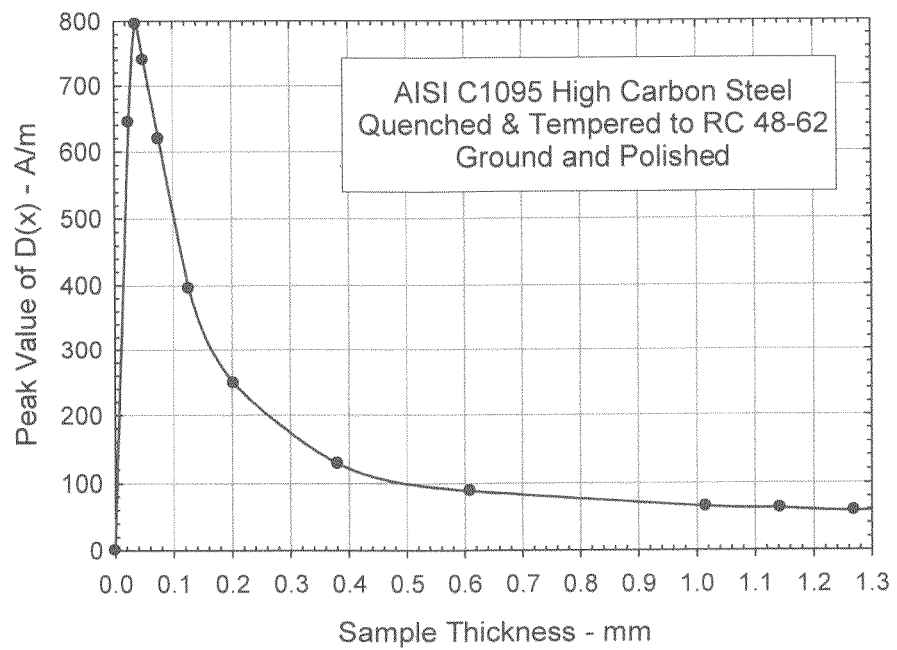
FIG. 19 is a graphical representation of the peak value of the directional difference in sensed magnetic fields D(x) as a function of sample thickness for samples of AISI C 1095 high carbon steel.
Figure 20:
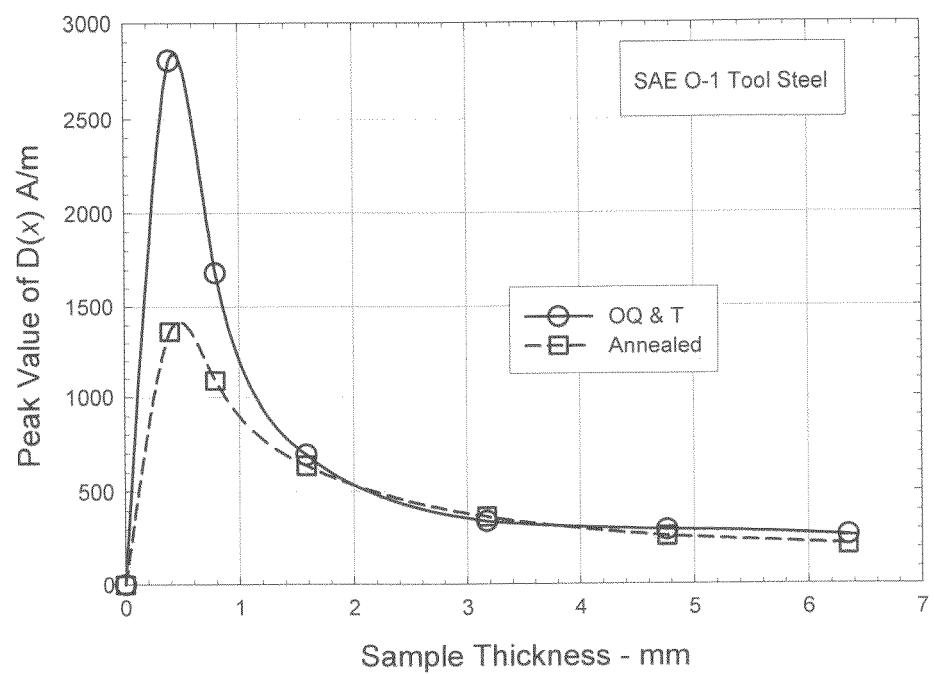
FIG. 20 is a graphical representation of the peak value of the directional difference in sensed magnetic fields D(x) as a function of sample thickness for samples of O-1 Tool Steel (both hardened and annealed).
Figure 21:
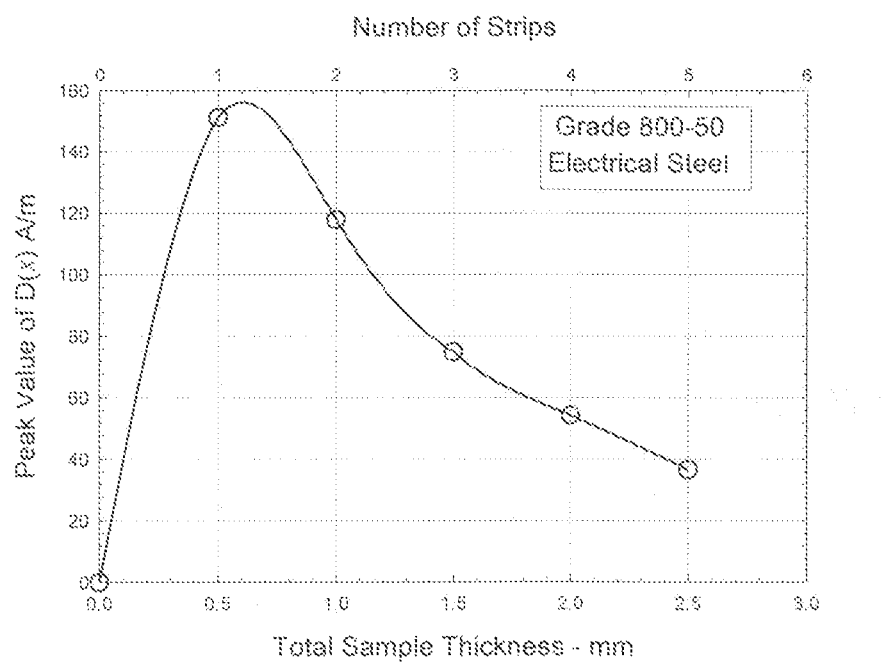
FIG. 21 is a graphical representation of the normalized peak value of the directional difference in sensed magnetic fields D(x) as a function of sample thickness for samples of NO electrical steel.

FIG. 17 illustrates the typical variation with magnet position in the longitudinal field measured at the underside of a sample comprising a 0.508 thick hardened and tempered C1095 shim during both forward and reverse motions over the range indicated. Also shown is the directional difference in these fields. FIG. 18 shows plots of $D(x)$ for samples of C 1095 high carbon steel having the thicknesses indicated (mm). The amplitudes of both the central peaks and the pairs of negative peaks are seen to vary in the same manner with sample thickness. While the zero crossings of all of the plots occur at closely the same position, the separation of the negative peaks shows a slight but consistent increase with increased sample thickness. FIG. 19 illustrates the variation of the positive peak value of D(x) with thickness of test samples comprising C1095 high carbon steel. Samples thicker than 1 mm were created by stacking 2-4 thinner samples. No significant differences were found for different combinations of samples adding to the same total thickness. Neither the stacking order, number of samples, nor choices of specific samples were distinguishable. FIGS. 20 and 21 shows a comparable variation of the positive peak value of D(x) with thickness of test samples for O-1 Tool Steel (both hardened and annealed) (FIG. 20) and stacked strips of NO electrical steel (FIG. 21).

Texture is an unavoidable consequence of the plastic deformations associated with the rolling processes used to fabricate metallic sheets, plates, and bars. Textures in ferromagnetic materials are manifested by in-plane anisotropy of structure dependent magnetic properties, most notably, permeability, coercivity, hysteresis loss. In Si steels, purposeful processing to enhance or reduce this anisotropy to benefit specific applications is commonly employed. While crystallographic methods are needed to characterize the texture itself, measurements of the anisotropy in any or all of the telling magnetic properties serve to portray its consequences. Measurements are typically made on rectangular strip samples, cut with their long dimension at various angles to the rolling direction (RD), sized to fit some standardized apparatus (e.g., Epstein Frame). Since all such methods measure global properties of the full sample cross section, which includes edge regions modified by the cutting process, samples are often stress relieved in neutral atmospheres. All such methods obtain their magnetizing fields from controllable power supplies. None are suitable for anisotropy measurements on such finished parts as motor stator/rotor laminations.

The hysteresis comparator sensor of the present invention has been shown hereinbefore, through analysis and experiment, to provide quantitative information directly related to coercive force. By its nature, such a sensor provides local (not global) measurement on regions with dimensions established by the apparatus (i.e., magnet size, distance to sample, stroke length), not the sample. No electrical power is needed to magnetize and measurement at any desired angle from the RD is obtainable from a single sample.

EXAMPLE 4

Samples of several steels, including grain oriented and non-oriented steels, were taken from rolled sheets of the steels identified by grade and orientation in FIG. 22. Each sample was circular, measured 29 mm in diameter and had the thickness indicated in FIG. 22. Using a sensor as schematically shown in FIG. 1(*b*) with magnet strength and dimensions constant for each sample, a magnet stroke of 20 mm length was used. The line of travel of the magnet was varied at 15° increments from 0° to 90° to the RD. This was achieved by attaching to each sample a label having appropriate angle markings and orienting the sample in the test apparatus by aligning the angle markings on the label with reference marks on the apparatus which indicated the direction of magnet motion.

FIG. 22 is a graphical representation of D(x) at the field sensor (D(0) as a function of angle to the rolling direction for each of the steels identified in the Figure. It is noteworthy that the values of D(0) for all of the curves seemed to generally increase with angle to the rolling direction except, perhaps, for Grade 290-50 which is well known to be an expensive, non-oriented electrical steel, and not expected to show much hysteresis. Not surprisingly, the curve for the grain oriented (GO) steel increased significantly with angle to the rolling direction and peaked at about 55°, the theoretical maximum value of D(0), and the values of D(0) observed for the grain oriented steel were significantly higher than the values observed for the other steels, which is consistent with the increased anisotropy associated with grain orientation. In cases where it is only necessary to obtain measurements in the rolling direction (RD) and transverse direction (TD) (90° to RD), a more simply prepared and aligned square sample, e.g., 30 mm square or smaller, may be used. The constancy of demagnetizing factors and location of the measurement stroke relative to the cut edges in the two measurement directions is thereby assured.

FIG. 23 is a graphical representation of D(0) as a function of length of stroke for 800-50 Grade NO electrical steel where the line of travel of the magnet was (1) in the rolling direction and (2) transverse (90° to RD) to the rolling direction. It is noteworthy that except close to the edges of the samples, the D(0) values observed were essentially constant within each line of travel, confirming that so long as anisotropic effects close to the cutting edges are avoided, samples can be quite small yet adequately demonstrate the effects of hysteresis. Thus, round disc samples and strokes significantly smaller than the disc diameter appear to preclude the need for annealing. Not only does the scanned region not include the edge regions, the most significant measurement is the peak value of D(x) and this occurs at the center of the sample, which is furthest from the edges and equally so for any angular orientation of the disc. One measure of the extent of anisotropy introduced by rolling in a direction transverse to the rolling direction is the TD/RD ratio, which for the 800-50 Grade NO electrical steel was seen to be about 1.2. Having in mind that a ratio of 1.0 would indicate no difference in hysteresis in the transverse direction as contrasted with the rolling direction, the observed ratio provides a quantitative indication of the increased anisotropy in the transverse direction caused by the rolling process.

While the present invention has been described in terms of specific embodiments thereof, it will be understood that no limitations are intended to the details of construction or design other than as defined in the appended claims.

The invention claimed is:

1. A non-contact magnetic sensor for non-destructively determining magnetic property degradation in a ferromagnetic sheet material sample by providing sensitive indications of salient hysteresis features of the ferromagnetic material, comprising:

permanent magnet means spaced closely adjacent to and a known distance from one surface of said sample, said magnet being polarized normal to said one surface and presenting a constant polarity to said surface;

at least one active field sensor means positioned along the surface of said sample opposite from said one surface, at a fixed position relative to said sample and at a known distance from said opposite surface;

said permanent magnet means and said at least one surface being mounted for and capable of relative back and forth reciprocating motion along a fixed line of travel whereby no point on said at least one surface is permitted to pass the magnet means more than once without changing direction, said field sensor means being positioned along and at the center of the line of travel, said one surface being generally flat or gently curved in the direction of motion; and said field sensor means having a sensing axis oriented to sense longitudinal fields arising from said magnet and from the gradient of magnetization arising in said sample;

whereby said magnetic field H(x) at said field sensor means for a number of corresponding magnet distances x from the field sensor means along the line of travel for both directions of back and forth movement between the magnet means and said at least one surface can be sensed for each direction of movement, a directional difference, D(x), between H(x) at distance x in each direction calculated and D(x) plotted against x (D(x) signature) for determining information indicative of hysteresis properties of said ferromagnetic sheet material sample.

2. A sensor, as claimed in claim 1, wherein said permanent magnet has a strength at said at least one surface sufficient for locally polarizing said at least one surface and establishing a stable remanent magnetization at all points along its line of travel and for reversing the local polarity of the polarized surface whenever said at least one surface passes in an opposite direction in close proximity to said permanent magnet.

3. A sensor, as claimed in claim 1, wherein said at least one active field sensor is positioned along the line of travel with its sensing axis substantially parallel to said at least one surface.

4. A sensor, as claimed in claim 1, wherein said active field sensor is a Hall effect sensor.

5. A sensor, as claimed in claim 1, wherein said at least one active field sensor comprises multiple active field sensors.

6. A sensor, as claimed in claim 1, wherein said permanent magnet means comprises multiple magnets spaced apart or adjacent in a single plane normal to the line of travel with like poles of each magnet facing toward said one surface of said sample.

7. A sensor, as claimed in claim 1, wherein said relative movement between said magnet means and said one surface of said sample comprises movement of said magnet while said one surface remains stationary.

8. A sensor, as claimed in claim 1, wherein said relative movement between said magnet means and said one surface of said sample comprises movement of said one surface while said magnet means remains stationary.

9. A sensor, as claimed in claim 1, further including means for converting said sensed magnetic field intensities H(x) and said sensed distances x for each direction of motion to separate electrical signals.

10. A sensor, as claimed in claim 9, further including a data acquisition system for processing the electrical signals, determining the directional differences, D(x), between sensed magnetic field intensities H(x) at each distance x of said magnet means from said field sensor means for both directions of back and forth motion and plotting D(x) vs. x, said plot providing information indicative of the hysteresis properties of the sample.

11. A sensor, as claimed in claim 1, wherein the fixed distance between the face of said permanent magnet means and said one surface of said sample is 0.05-2.5 mm.

12. A method for obtaining comparative measurements of hysteresis loss in a ferromagnetic sheet material sample comprising the steps of:

(a) arranging a permanent magnet closely adjacent to but spaced a known distance from one surface of said sample, said magnet being polarized normal to said one surface and presenting a constant polarity to said surface;

(b) arranging at least one active field sensor along the surface of said sample opposite from said one surface at a fixed position relative to said sample and at a known distance from said opposite surface and orienting the sensing axis of said field sensor to sense longitudinal fields arising from said magnet and from the gradient of magnetization arising in said sample;

(c) mounting said permanent magnet and said one surface for relative back and forth reciprocating motion along a fixed line of travel and causing said relative back and forth motion wherein no point on said at least one surface is permitted to pass the magnet more than once without changing direction, said field sensor being positioned along and at the center of said line of travel, said one surface being generally flat or gently curved in the direction of motion;

(d) sensing the intensity of the magnetic fields at said field sensor for a number of sensed magnet distances x from the field sensor along the line of travel for both directions of back and forth relative movement between the magnet and said one surface; and (e) converting said sensed magnetic field intensities H(x) and said sensed distances x for each direction of motion to separate electrical signals, calculating the directional difference, D(x), between H(x) in each direction at each distance x and plotting D(x) against x (D(x) signature) for determining the comparative hysteresis of said ferromagnetic sheet material sample from said plot.

13. A method, as claimed in claim 12, including the additional step prior to causing said relative back and forth motion of:

causing relative movement between said one surface of said sample and said permanent magnet along the line of travel such that said entire line of travel passes through the magnetic field of said magnet in both directions for obtaining stable magnetization excursions in said sample, said permanent magnet magnetic field having a strength at said one surface sufficient for locally polarizing said one surface and establishing a stable remanent magnetization at all points along its line of travel and for reversing the local polarity of the polarized surface whenever said one surface passes in an opposite direction in close proximity to said permanent magnet.

14. A method, as claimed in claim 12, wherein said at least one active field sensor is positioned along the line of travel with its sensing axis substantially parallel to said one surface.

15. A method, as claimed in claim 12, wherein said at least one active field sensor comprises multiple active field sensors.

16. A method, as claimed in claim 12, wherein said permanent magnet comprises multiple magnets spaced apart or adjacent in a single plane normal to the line of travel with like poles of each magnet facing toward said one surface of said sample.

17. A method, as claimed in claim 12, wherein said step of causing relative back and forth motion between said magnet and said one surface of said sample comprises causing movement of said magnet while said one surface remains stationary.

18. A method, as claimed in claim 12, wherein said step of causing relative back and forth motion between said magnet and said one surface of said sample comprises causing movement of said one surface while said magnet remains stationary.

19. A method, as claimed in claim 12, further including comparing the D(x) signature of said sample with the D(x) signature of a standard piece of said ferromagnetic sheet material, said D(x) signatures obtained under substantially identical conditions of magnetic field intensity, sample thickness and air gap between said magnet and said immediately adjacent surface of said sample or standard piece, wherein a higher or lower peak value of D(x) in the D(x) signature of said sample indicates increased or decreased hysteresis, respectively, in said sample.

20. A method, as claimed in claim 12, further including the steps of:
    reversing the surfaces of said sample adjacent the magnet and the field sensor;
    repeating steps (a) through (e) to obtain the D(x) signature of said sample in its reversed orientation; and
    comparing the D(x) signature of the sample in its original orientation with the D(x) signature of the sample in its reversed orientation, wherein different D(x) signatures in the original and reversed orientations indicates the presence and extent of property gradients within the sample.

21. A method, as claimed in claim 12, wherein said ferromagnetic sheet material sample had been formed by a rolling process, further including the steps of:
    performing steps (a) through (e) for determining the D(x) peak at the field sensor for said sample when the line of travel is in the rolling direction (RD);
    performing steps (a) through (e) for determining the D(x) peak at the field sensor for said sample when the line of travel is transverse to the rolling direction (TD) (90° to RD); and
    determining the ratio of D(x) peak in the TD to D(x) peak in the RD, wherein the difference between said ratio and 1.0 provides a quantitative indication of the anisotropy in magnetic hysteresis properties caused by the rolling process.

* * * * *